United States Patent
Mori et al.

(10) Patent No.: US 7,032,514 B2
(45) Date of Patent: Apr. 25, 2006

(54) PLANOGRAPHIC PRINTING METHOD, ORIGINAL PRINTING PLATE AND PRINTING PRESS

(75) Inventors: Nobufumi Mori, Kanagawa (JP); Takashi Nakamura, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 769 days.

(21) Appl. No.: 09/887,334

(22) Filed: Jun. 25, 2001

(65) Prior Publication Data

US 2002/0001776 A1   Jan. 3, 2002

(30) Foreign Application Priority Data

Jun. 26, 2000 (JP) ............ P2000-191690
Jan. 19, 2001 (JP) ............ P2001-011828

(51) Int. Cl.
*B41M 5/00* (2006.01)
*B41N 3/00* (2006.01)

(52) U.S. Cl. .................... 101/463.1; 430/302
(58) Field of Classification Search ............ 101/456, 101/463.1, 465, 466, 467, 478; 430/302
See application file for complete search history.

(56) References Cited

U.S. PATENT DOCUMENTS 6,048,654 A * 4/2000 Nakayama et al. ......... 101/467
6,079,331 A * 6/2000 Koguchi et al. ............ 101/467
6,318,264 B1 * 11/2001 D'Heureuse et al. ....... 101/467

FOREIGN PATENT DOCUMENTS

| JP | 58-5796 | | 2/1983 |
|---|---|---|---|
| JP | 8-123001 | | 5/1996 |
| JP | 8-290087 | | 11/1996 |
| JP | 8-290088 | | 11/1996 |
| JP | 9-138493 | | 5/1997 |
| JP | 2655337 | | 5/1997 |
| JP | 9-160208 | | 6/1997 |
| JP | 9-179272 | | 7/1997 |
| JP | 10-25131 | | 1/1998 |
| JP | 10-250027 | | 9/1998 |
| JP | 11-105234 | | 4/1999 |
| JP | 11-133631 | | 5/1999 |
| JP | 11-138970 | | 5/1999 |
| JP | 11-138971 | | 5/1999 |
| JP | 11-143055 | | 5/1999 |
| JP | 11-174664 | | 7/1999 |
| JP | 11-174665 | | 7/1999 |
| JP | 2000-62334 | * | 2/2000 |
| JP | 2000-62335 | * | 2/2000 |

* cited by examiner

*Primary Examiner*—Andrew H. Hirshfeld
*Assistant Examiner*—Leo T. Hinze
(74) *Attorney, Agent, or Firm*—Sughrue Mion, PLLC

(57) ABSTRACT

In a planographic printing method, an as-per-image distribution of hydrophilic areas and hydrophobic areas is formed by heating the surface of an original plate to a temperature ranging from 40 through 200° C. and irradiation of activation light after uniformly making the layer of a hydrophobic substance on an original printing plate having photo catalyst power. The hydrophobic areas receive ink whereby printing is carried out. An original printing plate having photo catalyst thin film therefor and a printing press therefor are also provided.

13 Claims, 6 Drawing Sheets

PLANOGRAPHIC PRINTING METHOD, ORIGINAL PRINTING PLATE AND PRINTING PRESS

BACKGROUND OF THE INVENTION

1. Field of the Invention

The present invention relates to a planographic printing method, an original printing plate and a planographic printing press. In particular, the invention relates to a simplified planographic printing method for making plates without any development, an original printing plate used therefor, and a printing press therefor.

2. Description of the Related Art

Planographic printing has widely been utilized along with presensitized plates (hereinafter called "PS plates") in the field of printing as a printing process suited to the needs in the printing market where a cost-reduced and simplified printing process is desired. As to the PS plates, a wet plate-making process is employed since a printing plate is prepared by a development process after images are recorded thereonto. Further simplification is desired in the recent printing market. In response to the market needs, as especially simplified plate-making processes not requiring any development in planographic printing, a number of plate-making processes have been proposed, by which printing plates are prepared by forming hydrophilic and hydrophobic image-by-image distributions using photo catalyst substances whose polarity may change by the irradiation of activation light. In these processes, since changes in a polarity, which are enough to separate ink acceptability and ink repulsion property in irradiation areas and non-irradiation areas, can be produced by only performing image-by-image exposure on an original plate, the original plate may be applied to printing without further process. Therefore, it can be said that these printing and plate-making processes are remarkably simple.

For example, in Japanese Unexamined Patent Publication Nos. 11-105234, 11-138970, 11-138971, 11-143055, and 11-174664, a printing and plate-making process has been developed, which hydrophilic and hydrophobic image distributions are formed by changing the polarities by irradiating activation light onto an original printing plate having a thin layer of a photo catalyst is metal compound. Also, in Japanese Unexamined Patent Publication No. 10-250027, such a process has been developed, which can carry out electrostatic printing after forming hydrophilic image areas on the hydrophobic surface having photo catalyst power by irradiating activation light thereonto as per image.

If the polarity conversion by activation light of the photo catalyst substances is utilized, it is very advantageous in view of simplification. However, if the printing quality and printing resistance are improved in addition thereto the practical value thereof can be further increased as a printing plate. Therefore, improvements will be attempted in terms of these points. Accordingly, it is necessary to severely distinguish the irradiation areas from non-irradiation areas for further improvement.

In Japanese Unexamined Patent Publication No. 10-25131, such a process has been proposed as a means for strengthening the distinction between them, which the difference between the hydrophilic property and hydrophobic property is strengthened by using silica or alumina materials on the surface in terms of strengthening the hydrophilic property and using a fluorine-based gas hydrophobic agent to improve the hydrophobic property. In addition, in Japanese Unexamined Patent Publication No. 11-133631, such a process has been disclosed, which improves the distinction between the hydrophilic property and hydrophobic property by decomposing the hydrophobic substances in the irradiation areas by the irradiation of activation light where a hydrophobic substance layer is provided on an original plate having photo catalyst power.

However, it is desirable that the distinction property of the irradiation areas and non-irradiation areas is further improved in original printing plates in which the polarity conversion of the photo catalyst substances is utilized. It is also desirable that a substantial shortcoming of the polarity changing rate in line with the irradiation of activation light being slow is corrected. If the polarity changing rate is slow, the sensitivity is lowered, wherein another problem occurs, that is, the depicting time by activation light is increased, and energy consumption is accordingly increased.

SUMMARY OF THE INVENTION

In a process for making plates and preparing printing plates using photo catalyst materials having advantages in views of simplicity in work for printing and plate-making, it is therefore an object of the invention to provide a planographic printing method that enables high sensitivity with respect to activation light for the recording of images, suppresses the consumption power in line with the irradiation of activation light, and ensures an excellent distinction property of imaged portions and non-imaged portion.

In details, the invention provides a printing method, having an excellent distinction property and not requiring any development, in which a printing surface is substantially formed by applying image-by-image exposure of activation light to an original plate, and the polarity changing rate of irradiation areas and sensitivity are high, and an original printing plate and a printing press, which are used therefor.

It is another object of the invention to provide a printing press in which the preparation of the above described printing plate can be carried out. Also, it is still another object of the invention to provide a printing plate by which an original printing plate can be repeatedly used.

With regard to the above problems and shortcomings, the present inventor has widely researched means for solving them through detailed examinations of factors regarding the polarity changing rate of substances having photo catalyst power. As a result, the inventor has found a fact that some photo catalyst substances remarkably increase the polarity changing rate due to the irradiation of activation light in a specified temperature area. Further, the inventor aggressively studied an application of the property to printing and plate preparation, and finally reached the present invention. That is, the invention is as follows;

1. A planographic printing method, comprising the steps of: uniformly providing a layer of a hydrophobic substance on an original printing plate having photo catalyst power; thereafter forming distributions of hydrophilic and hydrophobic areas as per image by heating the surface of the original plate to a temperature ranging from 40 through 200° C. and irradiating activation light thereonto; and performing printing by the hydrophobic areas accepting printing ink.

2. The planographic printing method according to the above described point 1, wherein at least the irradiation by the activation light is carried out as per image.

3. The planographic printing method according to the above described point 1, wherein the heating to a temperature ranging from 40 through 200° C. is carried out as per image.

4. The planographic printing method according to the above described point 1 or 2, wherein the heating of the original plate to a temperature ranging from 40 through 200° C. is carried out by light irradiation simultaneously with the irradiation of the activation light, and the activation light is irradiated so that the area thereof is included in the heating light irradiation area.

4a. The planographic printing method according to the above described point 4, wherein light for heating the original plate to a temperature ranging from 40 through 200° C. and activation light are irradiated image by image.

5. The planographic printing method according to the above described point 3, wherein the heating of the original plate to a temperature ranging from 40 through 200° C. is carried out by light irradiation simultaneously with the irradiation of the activation light, and the heating light is irradiated so that the area thereof is included in the activation light irradiation area.

5a. The planographic printing method according to the above described point 5, wherein light for heating the original plate to a temperature ranging from 40 through 200° C. and activation light are irradiated image by image.

6. The planographic printing method according to any one of the above described points 1 through 5, wherein the method for providing a layer of the hydrophobic substance is selected among a coating process, a spraying process, a vaporizing condensation process, a gas contact process, and an immersing and coating process.

7. The planographic printing method according to any one of the above described points 1 through 6, wherein the hydrophobic substance is a sublimating solid or a volatile liquid, and a gas of the hydrophobic substance is condensed on the surface of an original printing plate to provide a layer of the hydrophobic substance.

8. The planographic printing method according to any one of the above described points 1 through 6, wherein said hydrophobic substance is a macromolecular organic compound, and a solution or granular dispersoid of the macromolecular organic compound is sprayed onto the surface of original printing plate to provide a layer of a hydrophobic substance.

9. The planographic printing method according to any one of the above described points 1 through 8, wherein ink is removed from the printing plate once used for printing, and the printing plate is re-used as an original printing plate.

10. An original plate for planographic printing having photo catalyst power, in which the irradiation of activation light is carried out at a temperature of the original plate from 40 through 200° C.

11. The original plate for planographic printing according to the above described point 10, wherein the original plate having the photo catalyst power is composed of a metal oxide selected among $TiO_2$, $RtiO_3$ (R is an alkaline earth metal atom), $AB_{2-X}C_X D_{3-X}E_XO_{10}$ (A is a hydrogen atom or alkaline-metal atom, B is an alkaline earth metal atom or lead atom, C is a rare-earth atom, D is a metal atom belonging to the group 5A elements of the periodic table, E is a metal atom belonging to the group 4A elements, and X indicates an optional figure from 0 through 2), $SnO_2$, $ZrO_2$, $Bi_2O_3$, $ZnO$ and iron oxides expressed in terms of $FeO_X$ (x=1 through 1.5) as a photo catalyst substance.

12. The original plate for planographic printing according to the above described point 10 or 11, wherein a heat insulating layer is provided between a layer having photo catalyst power and a substrate.

13. A planographic printing press, comprising (1) a mounting section for mounting an original printing plate having photo catalyst power; (2) a section for hydrophobically processing the entire surface of the original plate on which a layer of a hydrophobic substance is provided; (3) an activation light irradiation section for irradiating activation light on an original printing plate carrying the hydrophobic layer as per image or on the entire surface thereof; (4) a section for heating the original plate, when irradiating the activation light, so that the temperature of the surface of the original plate becomes 40 through 200° C. as per image or on the entire surface thereof; (5) a section for supplying ink to the hydrophobic areas and supplying a damping solution to the hydrophilic areas; and (6) a section for printing by bringing a printing surface, which is composed so that the hydrophobic areas thereof accept ink and the hydrophilic areas thereof accept a damping solution, into contact with a surface to be printed.

In a planographic printing press, there are equipment that has an activation light irradiating section, in which the irradiation section of said activation light irradiates a printing original plate as per image, wherein the irradiated portions becomes hydrophilic by heating to obtain a hydrophilic and hydrophobic image distribution; equipment in which heating is carried out image by image, and the heated areas become hydrophilic to secure a hydrophilic and hydrophobic image distribution; and equipment in which heating and irradiation of the activation light are carried out image by image, and both give the same image information to an original plate.

14. The planographic printing press according to the above described point 13, wherein the heating means for heating and maintaining the surface of an original printing plate at an appointed temperature level when irradiating activation light is a light irradiating and heating means.

15. The planographic printing press according to the above described point 13, wherein the heating means for heating and maintaining the surface of an original printing plate at an appointed temperature level when irradiating activation light is an electro-heating means.

In the present invention, "a substance having photo catalyst power (also called a "photo catalyst substance")" is used in the meaning which is usually used in the field of optical semiconductors, which indicates a substance in which the physical property of the surface thereof optically changes from the hydrophobic property to the hydrophilic property by irradiation of light of a specified wavelength, such as titanium oxide, etc., and the light of a specified wavelength, which results in a change in the optical property is called "activation light".

The present invention basically relates to a printing method in which the sensitivity and distinction property have been improved by utilizing the polarity changing rate of the "substance having photo catalyst power" and peculiar temperature dependency of the degree of change, an original plate and machine that embodies the method. That is, the changing rate to the hydrophilicity by irradiation of activation light becomes fast in a certain temperature area, wherein it becomes possible to depict an image at a sufficient rate that does not hinder the work of making a plate. In addition, in a case where a change to the hydrophilicity by light irradiation at a room temperature is insufficient, high temperature irradiation improves the hydrophilicity. This contributes to improvement of the distinction property.

FIG. 1 shows the sensitivity-temperature properties in detail. FIG. 1 shows the relationship between the time required for hydrophilicity and temperature with respect to the surface polarity when the activation light is irradiated on titanium dioxide that is a typical photo catalyst substance. When an ultraviolet ray (activation light) whose energy intensity is 1.3 mW/cm$^2$ is irradiated onto the surface of titanium dioxide, the time required to cause the contact angle thereof to water on the surface to become 5 degrees is taken in view of the scale of polarity changing rate and is plotted along the ordinate while the surface temperature of titanium dioxide in irradiation is plotted along the abscissa. As has been made clear from FIG. 1, the hydrophilicity takes approx. 280 seconds at a normal temperature (room temperature), and approx. 100 seconds can be shortened at 60° C. And further approx. 20 seconds can be shortened at 120° C. Therefore, it is possible to accelerate the hydrophilicity to a level that does not hinder the plate making process, by utilizing the temperature effect.

Also, in a case where the degree of hydrophilicity resulting from light irradiation of a photo catalyst substance is insufficient by the exposure at a room temperature (the case where a hydrophobic substance layer is provided on the surface of an original plate as in a planographic printing method according to the invention corresponds thereto), a hydrophilic action of activation light appears by setting the irradiation temperature in the above described range. Therefore, the distinction property can be improved. This is also an advantage of the invention.

A planographic printing method according to the invention, in which the temperature effect of the above described photo catalyst substance is utilized, comprises a process in which a printing original plate having photo catalyst power is used, the entire surface of the printing original plate is made sufficiently hydrophobic by providing a layer of a hydrophobic substance, and while the temperature of the original plate is 40 through 200° C., an image-by-image distribution of hydrophobic areas and hydrophilic areas is formed on the original plate by irradiating activation light to secure a printing plate, wherein printing is carried out by applying printing ink and a damping solution to the plate surface. The method ensures excellent distinction by applying the hydrophobic layer, formation of images, which does not require any development, by a photo catalyst substance, simplifies the plate making process, and further secures a fast depicting rate by controlling the original plate temperature when irradiating activation light, and quick distinction, whereby the objects of the invention can be achieved.

As to the methods for forming an image-by-image distribution of hydrophilic areas and hydrophobic areas by irradiating activation light where the temperature of the above described original plate is 40 through 200° C., the following methods are available, (1) a method for making areas of irradiation into hydrophilic areas by carrying out image-by-image irradiation by activation light that is modulated by image information where the entire surface of an original plate is heated to the corresponding temperature; (2) a method for making the heated areas into hydrophobic areas by performing thermal application as per image by a thermal depicting means such as thermal head recording, infrared ray laser recording, etc., while irradiating activation light having light energy intensity to such a degree, at which no hydrophilic action appears at a normal temperature, onto the entire surface of a plate; and (3) a method for irradiating activation light and performing thermal application as per image. A preferred embodiment of method (3) is such that activation light and thermal application are carried out by a scanning system, wherein it is further preferable that the thermal application is made by image-by-image irradiation by an infrared ray laser.

In the case where the thermal application is performed by irradiation of an infrared ray laser beam, there are two cases, one of which is a case where the activation light enters the thermal application area because the area of irradiation thereof is narrow, and hydrophilic areas are formed by the irradiation of the activation light, and the other of which the thermal depicting area enters the image-by-image irradiation area of the activation light and hydrophilic areas are formed by thermal depicting.

Also, in the present specifications, the descriptions of entire-surface irradiation, entire-surface heating, and uniform irradiation includes both a system in which the entire surface is simultaneously irradiated and heated like flashing, and a system in which the entire surface is gradually irradiated or heated like scanning.

The process of making a plate according to the invention is commenced by making the entire surface of an original plate hydrophobic as described above. A method suitable for making the entire surface thereof hydrophobic may be selected among the following methods, that is, (1) coating of a hydrophobic substance that is a liquid, a solution or a spraying liquid, (2) spraying of granular hydrophobic substance, (3) condensing of vaporized hydrophobic substance onto the surface of an original plate, (4) adsorption due to a vaporized hydrophobic substance being brought into contact with an original plate, and (5) immersing process.

In the case of irradiating activation light onto the entire surface of an original plate whose entire surface is processed to be hydrophobic, the irradiation may be by uniform irradiation light onto the surface of the original plate, a scanning exposure system of slit beams, or a two-dimensional scanning exposure system of a-laser beam. The image-by-image irradiation of activation light to form an image-by-image hydrophilic area may be carried out by surface exposure light by which activation light is irradiated through an image mask, or by scanning exposure of a laser beam carrying image information. In the case of the latter, it may be by linear scanning exposure or two-dimensional scanning exposure using an array. The detail thereof is described later.

Either one of the heating means for maintaining the surface of an original printing plate at an appointed temperature when irradiating activation light may be used if it can control the temperature in a range from 40 through 200° C. However, an irradiation heating means of opto-thermal conversion light so-called heat wave (radiant heat) such as a halogen-tungsten lamp or an infrared ray lamp and a contact heating means with an electro-thermally heated metallic roller are preferable. Also, the heating means may be installed in a plate cylinder. In the case of image-by-image thermal application, depicting may be carried out by operations of the head, using a thermal depicting means such as a thermal head for thermal transfer. In addition, depiction by a scanning system by using an array in which a plurality of heads are linearly arranged is also preferable. But, the depicting means is not limited to a thermal head.

Thermal application and irradiation of activation light are simultaneously carried out (wherein "simultaneously" means that there is a time where thermal application and irradiation of activation light overlaps. It does not necessarily mean that the time of thermal application is coincident with the time of irradiation of activation light). In the case where a laser beam irradiation is applied to both thermal application and irradiation of activation light, it is preferable that the areas irradiated by the activation light is included in irradiation spots of the laser beam for heating. But it is not limited to this.

In the invention, it is possible to reuse an original printing plate by removing the printing ink on the printing plate after the printing is completed. At this time, it is possible to completely delete the image history on the printing plate by electrically heating the printing plate. The surface of the original printing plate for which a so-called initializing process has been carried out can restore its photo catalyst property.

The above described printing method according to the invention enables the above described plate-making process, printing process, and original plate regenerating process in a printing press after the original printing plate is mounted in the printing press. If a printing press that can carry out an original plate regenerating process is used, it is possible to repeatedly achieve the plate making and printing method according to the invention with the original plate mounted in a printing press. Therefore, an advantage in simplicity that the invention has can be further displayed. In this case, a printing press that is provided with a heating device for deleting the image history of an original plate is suitable. If the heating device is provided with a heating unit incorporating an electro-thermal heater in the plate cylinder, the image history can be simply deleted by electric heating, and the heating device does not require any surplus operation and is very favorable.

The invention can bring about the following effects:

A method for printing, by which a printing plate is prepared by forming an as-per-image distribution of hydrophobic areas and hydrophilic areas by a combination of heating the surface of an original plate to an appointed temperature ranging from 40° C. through 200° C. and irradiation of activation light after making a hydrophobic layer on an original printing plate having photo catalyst power enables speedy plate preparation without bringing about any limitation in the plate-making work since the polarity changing rate is made fast by irradiation, and can maintain a higher distinction between imaged areas and non-imaged areas. Moreover, the printing plate is directly prepared without requiring any development, and after printing is completed, the original printing plate can be repeatedly used by removing ink on the printing plate. Further, it is possible to carry out simplified and inexpensive offset printing by using a printing press in which an original plate is mounted on the plate cylinder of the printing press, hydrophilic processing, heat-mode depiction, supply of ink and a damping solution are carried out in the printing press, and the original plate is reproduced therein. Therefore, with the planographic printing method, original plate for planographic printing and planographic printing press according to the present invention, it is possible to further shorten the time required for plate preparation and to further improve the printing quality and durability in printing, in comparison with the plate-making and printing method for directly irradiating activation light as per image without providing any hydrophobic layer on an original plate having photo catalyst power and the plate-making and printing method for irradiating activation light without adjusting the temperature of an original plate to an appointed temperature ranging from 40 through 200° C.

DETAILED DESCRIPTION OF THE PREFERRED EMBODIMENTS

Figure 1:
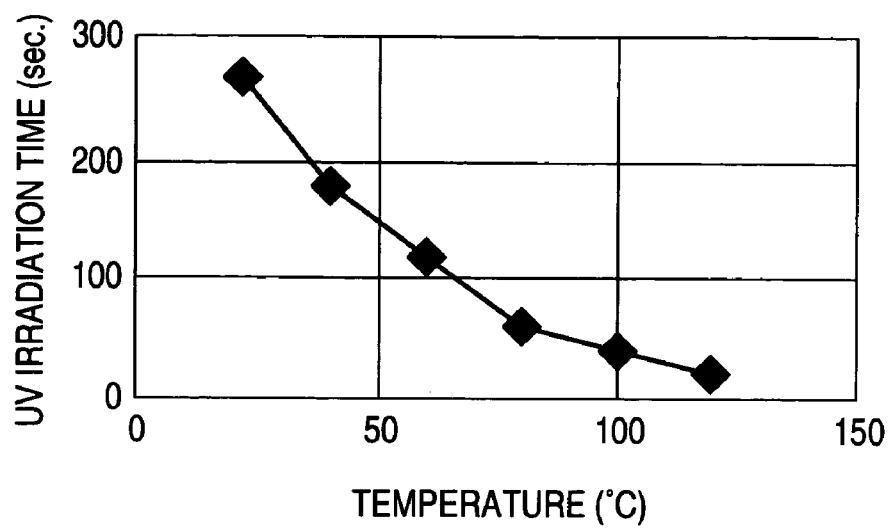
FIG. 1 is a view showing the relationship between the temperature of the surface of an original plate and polarity changing rate with respect to irradiation of activation light.

Hereinafter, a further detailed description is given of embodiments of the invention on the basis of the following sequence. First, a description is given of an original printing plate used for the invention, that is, a photo sensitive layer (so-called an image recording layer) make of a photo catalyst substance that constitutes the original plate, a heat insulating is layer that can be provided as necessary, and a substrate that carries the above. Next, a description is given of a plate making and printing method according to the invention, that is, a method for applying a hydrophobic layer onto the entire surface of an original plate, a method for applying heat onto the original plate whose entire surface is made hydrophobic and exposing images, a printing method, and a method for regenerating the printing plate after the printing is completed. Further, a description is given of a printing press according to the invention.

I. Original Printing Plate

[Photosensitive Layer]

(Photo Catalyst Substance)

A photo catalyst substance used for the invention is not necessarily limited to metal oxides. If factors required for an original printing plate are taken into consideration, a photo catalyst substance can be comparatively often found in metal oxides. The substance can be found in ceramics and semi-conductors. In many cases, the substance is made of a composite metal oxide. The substance having photo catalyst power can be found in both intrinsic semiconductors in which the basis order is close to a conductor and extrinsic semiconductors such as vanadium oxide and copper oxide depending on the impurity order.

As to a metal oxide used for the invention, various types of metal oxides are available. A single metal oxide or composite oxide may be acceptable. Also, in the latter case, either of a solid solution, mixed crystal, polycrystal, non-crystalline solid solution, and mixture of metal oxide microcrystals has the property. Based on experiences, a metal oxide having such a property can be found in oxide with metal elements belonging to the 3rd period through the 6th period excluding the groups of 0 and VIIA (halogen element) in the periodic table.

In addition, since the above described metal and metal oxide must not be excessively dissolved with respect to a damping solution when being used as an printing plate, the solubility with respect to water is 10 mg or less per water of 100 milliliters, preferably 5 mg or less, further preferably 1 mg or less.

A titanium oxide and zinc oxide is preferable among "metal oxide having photo catalyst power". First, a description is given of these oxides. These oxides maybe used as a material of printing plates, which has a photo response property according to the invention. In particular, titanium oxide is preferable in view of sensitivity (that is, sensitivity of the surface with respect to an optical change). Titanium oxides that are produced by any one of optional publicly known methods such as sulfuric acid thermal burning of ilmenite and titanium slag or oxygen oxidization after heating chlorination thereof maybe used. Or as described later, such a method may be used, which secures an oxide film by vacuum vapor deposition at the stage of preparing a printing plate by using metal titanium.

In order to provide the surface of an original plate with a layer containing a titanium oxide or zinc oxide, for example, the following publicly known methods may be used, that is, (1) a method for coating a dispersoid of titanium oxide microcrystals or zinc oxide microcrystals onto an original plate of a printing plate; (2) a method for reducing or removing the binder by burning after coating the dispersoid; (3) a method for providing a titanium oxide (or zinc oxide) film on an original printing plate by a process such as vapor deposition, spattering, ion plating, CVD, etc.; (4) a method for preparing a titanium oxide layer by burning and oxidizing an organic compound of titanium such as, for example, titanium butoxide after coating the same on an original plate, etc. In the present invention, a titanium oxide layer prepared by vacuum vapor deposition or spattering is especially preferable.

As the method for coating titanium oxide microcrystals according to the above described (1) or (2), in detail, there are a method for coating a dispersoid of amorphous titanium oxide microcrystals and thereafter making a anatase or rutile type crystallized titanium oxide layer by burning the same; a method for coating a mixed dispersoid of titanium oxide and silicon oxide and forming the surface layer; a method for securing a titanium oxide layer in which a mixture of titanium oxide and organosiloxane, etc., are coated and bound with the substrate through siloxane binding; and a method for removing organic compounds by burning after dispersing a polymer binder, which coexists with oxides, in an oxide layer. Polymer that has a dispersability with respect to titanium oxide particulates and can be removed by burning at a comparatively low temperature is preferably used as the binder of oxide particulates. As an embodiment of a preferable binder, a hydrophobic binder such as polyethylene, for example, polyalkylene, polybutadiene, polyacrylate ester, polymethacrylate ester, polyvinyl acetate, polyvinyl acetate, polyethyleneterephthalate, polyethylene naphthalate, polyvinylalcohol, partially saponified polyvinyl alcohol, polystyrene, etc., is preferable. These resins are blended and may be used.

In order to carry bout vacuum vapor deposition of titanium oxide according to the above described (3), for example, usually, metal titanium is placed at the heat source to heat for vapor deposition in vacuum vapor deposition equipment, the titanium metal is vaporized while keeping the entire gas pressure at $10^{-2}$ Pa and the partial pressure of oxygen at 30 through 95%, wherein a deposited thin film of titanium oxide is formed on the depositing surface. Also, in the case of spattering, for example, a titanium metal target is set in spattering equipment. The gas pressure is adjusted to $5 \times 10^{-1}$ Pa so that the ratio of Ar/O2 becomes 60/40 (molar ratio), and thereafter, spattering is carried with the RF power of 200 W charged, wherein a titanium oxide thin film is formed on a substrate.

On the other hand, in the case of using a zinc oxide layer in the invention, the zinc oxide layer may be prepared by either of optional publicly known methods. Particularly, a method for forming an oxide film by electrolytically oxidizing the surface of the metal zinc plate, and a method for forming a zinc oxide film by vacuum vapor deposition, spattering, ion plating, CVD, etc., are preferable.

When making a deposited film of zinc oxide, a method for forming an oxide film by depositing metal zinc under the existence of oxygen gas as in the above described vapor deposition of titanium oxide, and a method for oxidizing zinc metal with the temperature raised to approx. 700° C. in the air after having formed a zinc metal film in an oxygen-free condition may be used.

In addition thereto, a deposited film of zinc oxide may be obtained by heating a coated layer of zinc oxalate and a thin layer of zinc selenide in an oxidizing air stream.

It is preferable that the thickness of the deposited film is 0.1 through 10000 nm in either case of a titanium oxide layer or a zinc oxide layer. Preferably, the thickness is 1 through 1000 nm. Further preferably, 300 nm or less, whereby distortions due to optical interference can be prevented from occurring. Also, it is favorable that the thickness is 5 nm or more in view of displaying full performance of an optical activation action.

Crystalline titanium oxides may be used. However, particularly, anatase type crystal has a higher sensitivity and is preferable. It has been publicly known that the anatase type crystal is obtained by selecting the burning conditions in the process of burning to secure titanium oxides. In this case, amorphous titanium oxide and rutile type titanium oxide may coexist. However, it is preferable in view of the above described reason that the anatase type crystal is 40% or more, preferably 60% or more.

The volume ratio of titanium oxide or zinc oxide in the layer whose main constituent is titanium oxide or zinc oxide is 30 through 100%, respectively. It is preferable that the oxide occupies 50% or more. Further preferably, a continuous layer of the oxide, that is, substantially 100% is desired. However, since the hydrophilic/lipophilic changing property is not remarkably influenced by purity where the zinc oxide is used for an electronic photographing sensitivity layer, it is not necessary to further increase the purity of zinc oxide whose purity is nearly 100% (for example, 98%). This can be also understood on the basis of that the physical property utilized for the invention is a changing property in the hydrophilic and lipophilic characteristics of the film surface not pertaining to the conductivity, that is, the changing property in the boundary phase.

However, there is a case where it is effective to dope a certain type of metal in order to foster the characteristics by which the hydrophilicity of the surface changes by a thermal action. Doping of a metal whose ionizing tendency is slight is suitable for this object. It is preferable to dope Pt, Pd, Au, Ag, Cu, Ni, Fe, Co or Cr. Also, a plurality of these favorable metals may be doped. If doping is carried out, the amount of doping is kept on 5 molar percents or less with respect to the metal constituents of zinc oxide and titanium oxide.

Next, a description is given of metal titanate, expressed in terms of general chemical formula $RTiO_3$, which is another chemical compound that can be used in the invention. In the general formula $RTiO_3$, R is a metal atom belonging to alkaline earth elements in the periodic table, such as magnesium, calcium, strontium, barium, beryllium, etc. In particular, strontium and barium are preferable. Two or more types of alkaline earth metal atoms may coexist as far as the total thereof matches the above described formula in terms of stoichiometry.

Next, a description is given of the compound expressed in terms of general formula $AB_{2-x}C_xD_{3-x}O_{10}$. In this general formula, A is a monovalent atom selected from a hydrogen atom and alkali metal atoms such as sodium, potassium, rubidium, cesium, lithium, etc., and two or more types thereof may coexist as far as the total thereof matches the above described formula in terms of stoichiometry.

B is an alkaline earth metal atom or lead atom of the same meaning as that of the above described R, wherein two or more types thereof may coexist as far as the total thereof matches the above described formula in terms of stoichiometry.

C is a rare-earth atom, which is preferably an atom belonging to scandium, yttrium, and lanthanoide series such as lantanum, cerium, praseodymium, neodymium, holmium, europium, gadolinium, terbium, thulium, ytterbium, lutetium, etc., wherein two or more types thereof may coexist as far as the total thereof matches the above described formula in terms of stoichiometry.

D is one or more elements selected from the group 5A elements in the periodic table, wherein vanadium, niobium, or tantalum may be listed. Two or more types of the group 5A metal elements may coexist as far as they meet the stoichiometric relationship.

E is also a metal atom belonging to the group 4A metal elements such as titanium, zirconium, hafnium, etc., wherein two or more types of the group 4A metal atoms may coexist.

X indicates any optional figure from 0 through 2.

When forming a thin film made of either of $RTiO_3$, the above described compounds expressed in terms of $AB_{2-x}C_xD_{3-x}E_xO_{10}$, $SnO_2$, $ZrO_2$, $Bi_2O_3$, or $Fe_2O_3$, the above described method in which titanium oxide and zinc oxide is provided may be used. That is, any optional publicly known methods may be used, for example, (1) the method for coating a dispersoid of particulates of the above described photo catalyst metal oxide on an original plate of a printing plate; (2) the method for reducing or removing a binder by burning the dispersoid after having coated it; (3) the method for forming a film of the above described oxide on the original plate of the printing plate by various types of vacuum thin-film methods; (4) the method for securing a metal thin film of an appropriate thickness by hydrolyzing and further burning to oxidize an organic compound such as, for example, an alcolate of a metal element after having coated the same on the original plate; and (5) the method for heating and spraying a water solution such as hydrochloride, nitrate, etc., containing the above described metal.

For example, in order to coat barium titanate particulates by the coating methods (1) and (2), there are a method for forming a surface layer by coating a mixed dispersoid of barium titanate and silicon, and a method for coating a mixture with barium titanate and organopolysiloxane or its monomer. Also, as described with respect to titanium oxide, barium titanate is dispersed in a polymer binder that can coexist together with oxides and is coated in a layer of oxide. Thereafter, the layer of oxide can be formed by burning the barium titanate. Examples of polymer that is preferable as a binder of oxide particulates are the same as those described in regard to the layer of titanium oxide.

By this method, it is possible to form a thin film, using magnesium titanate, calcium titanate, strontium titanate or these intermolecular compounds or mixtures in addition to barium titanate.

Similarly, by the coating methods (1) or (2), it is possible to coat $CsLa_2NbTi_2O_{10}$ particulates. The $CsLa_2NbTi_2O_{10}$ particulates are produced by pulverizing $Cs_2CO_3$, $La_2O_3$, $NbO_5$, and $TiO_2$ corresponding to the stoichiometry thereof in a mortar, placing them in a platinum crucible, burning them for five hours at 130° C., and further pulverizing them to particles of several microns or less in a mortar after cooling down. The $CsLa_2NbTi_2O_{10}$ particulates are dispersed in a binder as in the above described barium titanate, and coated to produce a thin film. This method is not limited to $CsLa_2NbTi_2O_{10}$ type particulates, but it is applicable to the above described $AB_{2-x}C_xD_{3-x}E_xO_{10}$ ($0 \leq x \leq 2$) such as $HCa_{1.5}La_{0.50}Nb_{2.5}Ti_{0.5}O_{10}$, $HLa_2NbTi_2O_{10}$.

As the method for forming a photo catalyst metal oxide layer using the above described vacuum thin film forming method (3), a sputtering method and a vacuum thin film forming method are generally used. In the sputtering method, a single or composite oxide target is prepared in advance. For example, by carrying out RF sputtering in an atmosphere of argon/oxygen mixture by using a barium titanate target with the temperature of a substrate for vapor deposition film kept at 450° C. or more, a barium titanate crystal thin film can be obtained. In order to control the crystallinity, post-annealing is carried out at a temperature of 300 through 900° C. According to the method, it is possible to form a thin film with respect to the above described photo catalyst metal oxides including the above described $RTiO_3$ (R is an alkaline earth metal atom) based on the same idea if the substrate temperature is adjusted to be optimal for crystalline control.

For example, in the case of providing a tin oxide thin film, a thin film of tin oxide crystal suited to the object of the invention can be obtained by carrying out RF sputtering in an atmosphere of a mixture of argon and oxygen at a ratio of 50% to 50% at a temperature of the substrate of 120° C.

The method in which metal alcolate is used according to the above described (4) is a method that can form the target thin film without using any binder. In order to form a thin film of barium titanate, a mixed alcohol solution of barium ethoxide and titanium buthoxide is coated on a silicon substrate having $SiO_2$, and the surface thereof is hydrolyzed. Thereafter, by heating it to 200° C. or more, it becomes possible to form a thin film of barium titanate. The method of this system is also applicable to the formation of thin films of the above described other $RTiO_3$ (R is an alkaline earth metal atom), $AB_{2-x}C_xD_{3-x}E_xO_{10}$ (A, B, C, D and E, respectively, indicate the content of the above described definition), $SnO_2$, $ZrO_2$, $SiO_2$, $Bi_2O_3$ and $Fe_2O_3$.

The method for forming a metal oxide thin film that generates photo catalyst power by the above described (5) enables the formation of a thin film of a system not containing any binder. In order to form a thin film of $SnO_2$, a hydrochloric acid solution of $SnCl_4$ is sprayed onto a quartz or crystalline glass surface that is heated to 200° C. or more to generate a thin film. This system is also applicable to the formation of thin films of any one of the above described other $RTiO_3$ (R is an alkaline earth metal atom), $AB_{2-X} C_X D_{3-X} E_X O_{10}$ (A, B, C, D and E, respectively, indicate the content of the above described definition), $Bi_2O_3$ or $Fe_2O_3$.

In any one of the above cases, it is desirable that the thickness of a metal oxide thin film is 0.1 through 10000 nm, preferably 1 through 1000 nm, and further preferably 300 nm or less, thereby preventing distortion due to optical interference. Also, it is preferable that the thickness thereof is 5 nm or more to sufficiently generate the optical activation action.

The volume ratio of a metal oxide is 50 through 100% in the thin film of the above described photo catalyst metal oxide in the case where a binder is used. It is preferable that the oxide occupies 90% or more. It is better that the oxide is made continuous, that is, substantially occupies 100% of the volume.

[Layer Having an Opto-Thermal Conversion Action]

It is also possible to provide an original printing plate with a layer (so-called a heat-generating layer) having an opto-thermal conversion action. The layer is provided as an underlayer of the photo sensitive layer as necessary. The layer is heated by light irradiation, wherein the heating of the original plate can be facilitated, and the efficiency of heat utilization can be increased.

Such a heat generating layer may be made of organic or inorganic resin and an opto-thermal conversion agent, which becomes the source of heat generation, or an opto-thermal converting metal thin film.

[Heat Insulating Layer]

In an original printing plate used for the invention, a heat insulating layer may be provided between the photo sensitive layer and substrate to prevent heat from diffusing to the substrate in order to effectively utilize heat energy supplied by the opto-thermal conversion for the purpose of changes in polarity or formation of images. In this case, in the case where the original printing plate is provided with a heat-generating layer and further provided with a heat insulating layer, the heat insulating layer is secured at the side which is nearer to the substrate than the heat generating layer.

The heat insulating layer may be composed of, preferably a bonded material selected from organic macromolecular materials and inorganic sol-gel converting material. The layer that is composed of an organic macromolecular material may be a resin layer made of either hydrophobic resin or hydrophilic resin. In the case of a hydrophobic resin layer, it is a water-based emulsion layer in which minute polymer particles and particles made of a protection agent to disperse and stabilize the corresponding particles as necessary are dispersed in water. As a detailed example, vinyl-based polymer latex (polyacrylate-based, vinyl acetate based, ethylene-vinyl acetate based, etc.), conjugate diene based polymer latex and polyurethane resin, etc., may be listed.

Concretely, as the hydrophilic resin layer, a layer made of denatured PVA such as polyvinyl alcohol (PVA), carboxy denatured PVA, etc., cellulosic derivatives such as hydroxyethylcellulose, polyacrylate and derivatives, polyvinylpyrrolidine may be listed.

As an inorganic macromolecular heat insulating layer, an inorganic matrix formed by sol-gel conversion is preferable. The system that can be preferably applied to the invention and can be converted in terms of sol-gel is a macromolecular body in which a binding group bound to a polyvalent element forms a meshed structure via oxygen atoms, and simultaneously polyvalent metal has non-bound hydroxy and alkoxy, and a resin-like structure having these hydroxy and alkoxy mixed. The macromolecular body is sol-like at the stage where a plenty of alkoxy and hydroxy exist, and its gel-like structure is strengthened in line with progress of hydrolysis condensation. A polyvalent bound element of a compound having hydroxy and alkoxy, which carries out sol-gel conversion is aluminum, silica, titanium, and zirconium, etc. All of these can be used for the invention. The layer of an inorganometallic oxide may be provided by publicly known methods such as anode oxidation, vapor deposition, CVD, spattering, electro-deposition, etc., in addition to the above described sol-gel conversion method.

The thickness of the heat insulating layer is 0.1 through 200 μm, preferably 0.1 through 50 μm.

[Substrate]

When a photo catalyst substance is provided on a substrate, the substrate that is used is not thermally decomposed at a temperature of generating a hydrophobic property and is like a plate that is dimensionally stabilized. That is, a metal plate such as an aluminum plate, stainless steel plate, nickel plate, or copper plate is preferable. In particular, a flexible metal plate is preferably used. Also, a flexible plastic substrate such as polyester, cellulosic ester, etc., maybe used. An oxide layer maybe provided on a substrate such as a waterproof processed sheet, polyethylene laminated sheet, impregnated sheet, etc., and it may be used as a printing master plate.

In detail, paper, plastic sheet (for example, polyethylene terephthalate sheet, polyimide sheet, etc.,) laminated paper, metallic plate (for example, aluminum, zinc, copper and stainless steel, etc.), plastic film (for example, cellulose diacetate, cellulose triacetate, cellulose propionate, butyric acid, cellulose, cellulose butyric acid acetate, cellulose nitrate, polyethylene terephthalate, polyimide, polystyrene, polycarbonate, polyvinyl acetal, etc.), paper on which the above described metals are laminated or vapor-deposited, or plastic film, etc., may be listed.

A preferable substrate is a polyester film, a polyimide film, an aluminum plate or a stainless steel plate that does not corrode on a printing master plate. An aluminum plate which has well stabilized dimensions and is comparatively cheap, and a polyimide film which is well stabilized with respect to a heating operation in the plate-making process are especially preferable.

A preferable polyimide film is a polyimide resin film that is made to be annular-imide after polymerizing pyromellitic anhydride and m-phenylenediamine. The film is available in the market (For example, "KAPTON" supplied by DU PONT-TORAY CO.,LTD.).

A preferable aluminum plate is a pure aluminum plate and an alloy plate, whose major constituent is aluminum, containing a little bit of different elements, and further it may be a plastic film to which aluminum is laminated or vapor-deposited. Different elements contained in the aluminum ally maybe silica, iron, manganese, copper, magnesium, chrome, zinc, bismuth, nickel, titanium, etc. The content ratio of these different elements is 10% by weight at most. The most preferable aluminum in the present invention is pure aluminum. However, since it is very difficult to produce pure aluminum in terms of there fining technology, the pure aluminum may contain as light amount of different elements. Thus, as to the aluminum plate applied to the invention, the composition is not specified, and an aluminum plate which is one of publicly known and commonly used materials since before may be adequately used. The thickness of the metal substrate used for the invention is approx. 0.1 mm through 0.6 mm, preferably 0.15 mm through 0.4 mm, and further preferably, 0.2 mm through 0.3 mm. The thickness of other substrates such as plastic and processed paper is approx. 0.1 mm through 2.0 mm, and preferably 0.2 mm through 1.0 mm.

In the case where an aluminum substrate is used, it is preferable to grain the surface of the aluminum plate. In this case, a degreasing process using, for example, a surface-activating agent, an organic solvent or alkali water solution, etc., is carried out in order to remove rolling oil on the surface prior to graining as necessary.

A process for graining the surface of an aluminum plate may be carried out by various methods. However, for example, there are a method for mechanically graining the surface, a method for electro-chemically dissolving and graining the surface, and a method for chemically dissolving to grain the surface selectively. A publicly known method such as a ball polishing method, a brush polishing method, a blast polishing method, and a buff polishing method, etc., may be used as the mechanical graining method. A publicly known method for graining the surface in hydrochloric or nitric electrolytic solution by AC or DC may be utilized as the electrochemical graining method. Further, the grained aluminum plate is subjected to an anodic oxidation process in order to increase the humidity keeping property and wear resisting property of the surface as necessary after an alkali etching process and a neutralizing process as necessary. The density of an electrolyte for anodic oxidation may be adequately determined on the basis of the type of the electrolyte.

The processing conditions of the anodic oxidization cannot be indiscriminately determined as they may change according to the electrolyte to be used. Generally, it is appropriate that the concentration of the electrolyte is 1 through 80% by weight in terms of the solution, the liquid temperature is 5 through 70° C., the current density is 5 through 60 A/dm$^2$, voltage is 1 through 100V, and the electrolyzing time is 10 seconds through 5 minutes.

If the amount of the anodic oxidization film is 1.0 g/m$^2$ or less, the impression resisting property becomes insufficient, or non-imaged sections of a planographic printing master plate maybe liable to be damaged, wherein ink is adhered to the damaged sections when printing, and a so-called "damage stain" is likely to occur.

[Embodiment of an Original Printing Plate]

Next, a description is given of embodiments of an original printing plate used for the invention.

Figure 9:
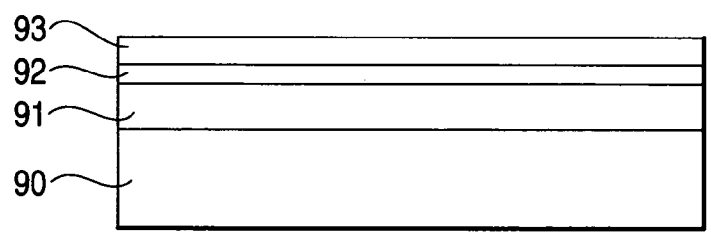
FIG. 9 is an exemplary view showing the layer construction of one example of an original printing plate used for the invention.

The original printing plate according to the invention may employ various types of embodiments and materials. For example, a photosensitive layer may be provided directly on a substrate, and the photosensitive layer may be provided on a heat insulating layer secured on the substrate. Further, it maybe provided on a heat generating layer secured on the substrate. Still further, a heat insulating layer and heat generating layer are provided, and another heat generating layer may be provided thereon. FIG. 9 is a view showing an exemplar of the construction of an original printing plate according to a preferred embodiment of the invention. In FIG. 9, the original printing plate is such that a heat insulating layer 91 of silicon dioxide, having a thickness of 30 μm, is provided on a substrate 90 by electro-deposition, and a 2 μm thick silicon thin film is provided as a heat generating layer 92 thereon. A 0.2 μm thick layer, having photo catalyst power, which is made of titanium dioxide is provided on the heat generating layer 92 as a photo sensitive layer 93. FIG. 9 shows just one of the typical embodiments, by which the invention is not limited.

An embodiment of the invention with respect to the relationship between an original printing plate and a printing press may employ a method for providing a thin film of a photo catalyst substance directly on the surface of the plate cylinder by the above described method for vapor-depositing, immersing or coating it on the matrix surface of the plate cylinder of a printing press.

Also, in addition to the abovementioned embodiment in which a plate is processed on the plate cylinder, it is a matter of course that an embodiment in which a processed printing master plate is attached onto a rotary type or flat-bed type press is employed as has been generally performed.

II Plate Making Process

[Hydrophobic Processing on the Entire Surface]

The entire surface of an original printing plate is processed to be hydrophobic. It has been disclosed in Japanese Unexamined Patent Publication Nos.H11-174665, H11-138970 and H11-143055 that many of photo catalyst metal oxides are made hydrophobic by being heated to, for example, 80 through 140° C. However, in the invention, in order to further improve the distinction property between imaged sections and non-imaged sections, further intensive hydrophobic processing is carried out by an entire surface hydrophobic process by which a film of a hydrophobic substance is provided on the entire surface of an original printing plate. The substances used to form a hydrophobic film is called a "hydrophobic processing agent".

First, the hydrophobic processing agent is explained, and next, the method of hydrophobic processing is explained.

[Hydrophobic Processing Agent]

In the invention, "hydrophobic" indicates a larger drop contacting angle than the drop contacting angle of the hydrophilic and lipophilic surface, and it means that the drop contacting angle is 60 degrees or more, preferably 70 degrees of more.

The hydrophobic processing agent is hydrophobic in view of the abovementioned meaning, and is a material to form a thin film. It can be selected in a wide range.

A compound suited to the object of the hydrophobic processing agent according to the invention can be found among organic low molecular compounds, organosilicon compounds, and organic macromolecular compounds.

1) Organic Low Molecular Compounds

The organic low molecular compounds used for the invention as the hydrophobic processing agent are an organic macromolecular compounds corresponding to at least any one of (1) the solubility with respect to water of 100 g being 2 g or less at 25° C. and (2) the organic/inorganic ratio in the organic conceptual diagram being 0.7 or more. A compound that meets both of them is also a preferred embodiment. Herein, a substance that is called a "low molecular compound" is a compound having a boiling point or a melting point. Usually, the molecular weight of such a compound is 2000 or less, and in many cases, 1000 or less.

It is a factor as a printing master plate that the solubility into water of 100 g at 25° C. is 2 g or less. Through experiments, it is found that this is also a factor to secure the hydrophobic property.

The organic conceptual diagram is a practically simple and effective scale in order to show the degree of the organic property and inorganic property of chemical compounds. The detail thereof is described in "Organic Conceptual Diagram" whose author is Yoshio Tanaka, pages 1 through 31 (published by the Sankyo Shuppansha, Ltd., the first edition in 1983). Although the reason why organic compounds in the abovementioned range in the organic conceptual diagram have an action to foster the hydrophobic property is not clear, the compounds in the range are those whose organic property is comparatively great, and make portions in the vicinity of composite particles hydrophobic. The organic property in the organic conceptual diagram is 100 or more and no limitation exists as to the upper limit. However, such organic compounds are preferable, in which the organic property is usually 100 through 1200, preferably 100 through 800, and the ratio of the organic property to the inorganic property is 0.7 to infinite (that is, the inorganic property is zero), preferably 0.9 through 10.

Organic low molecular compounds having the solubility into water and the organic/inorganic property ratio in the organic conceptual diagram are, in detail, aliphatic and aromatic hydrocarbon, aliphatic and aromatic carboxylic acid, aliphatic and aromatic alcohol, aliphatic and aromatic ester, aliphatic and aromatic ether, organic amine, organosilicon compounds, or are found in various types of solvents and plasticizing agent that are known to be added to printing ink.

Preferable aliphatic hydrocarbon is 8 through 30 in carbon number, further preferably 8 through 20. Preferable aromatic hydrocarbon is 6 through 40 in carbon number, further preferably 6 through 20. Preferable aliphatic alcohol is 4 through 30 in carbon number, further preferably 6 through 18 in carbon number. Preferable aromatic alcohol is 6 through 30 in carbon number, further preferably 6 through 18 in carbon number. Preferable aliphatic carboxylic acid is 4 through 24 in carbon number, and further preferably is aliphatic monocarboxylic acid of 6 through 20 in carbon number and aliphatic polycarboxylic acid of 4 through 12 in carbon number. Preferable aromatic carboxylic acid is 6 through 30 in carbon number, and further preferably 6 through 18 in carbon number. Preferable aliphatic ester is 2 through 30 in carbon number, further preferably 2 through 18 in carbon number. Preferable aromatic ester is 8 through 30 in carbon number, and further preferably, aromatic carboxylic acid ester of 8 through 18 in carbon number. Preferable aliphatic ether is 8 through 36 in carbon number, further preferably 8 through 18 in carbon number. Preferable aromatic ether is 7 through 30 in carbon number, further preferably 7 through 18 in carbon number. Other aliphatic or aromatic amide of 7 through 30 in carbon, further preferably 7 through 18 in carbon number may be used.

As detailed examples, aliphatic hydrocarbon such as 2,2,4-trimethylpentan (isooctane), n-nonane, n-decane, n-hexadecane, octadecane, eicosane, methylheptane, 2,2-dimethylhexane, 2-methyloctane, etc.; aromatichydrocarbon such as benzene, toluene, xylene, cumene, naphthalene, anthracene, styrene, etc.; monovalent alcohol such as dodecyl alcohol, octyl alcohol, n-octadecyl alcohol, 2-octanol, lauryl monovalent alcohol; polyvalent alcohol such as hexylene glycol, dipropylene glycol, etc.; aromatic alcohol such as benzyl alcohol, 4-hydroxy toluene, phenetyl alcohol, 1-naphthol, 2-naphthol, catechol, phenol, etc.; aliphatic monovalent carboxylic acid such as butylic acid, caproic acid, acrylic acid, crotonic acid, capric acid, stearic acid, oleic acid, etc.; aromatic carboxylic acid such as benzoic acid, 2-methyl benzoate, 4-methyl benzoate, etc.; fatty acid ester such as ethyl acetate, isobutyl acetate, acetate-n-butyl, methyl propionate, ethyl propionate, methyl butylate, methyl acrylate, dimethyl oxalate, dimethyl succinate, methyl crotonate, etc.; aromatic carboxylate such as methyl benzoate, methyl 2-methyl benzoic acid, etc.; organic amine such as imidazole, 2,2-dimethylimidazole, 4-methylimidazole, indazole, benzoimidazole, cyclohexylamine, hexamethylenetetramine, triethylenetetramine, octylamine, phenetylamine, etc.; ketone such as methyl-ethyl ketone, methylisobutyl ketone, benzophenone, etc,; ether such as methoxybenzene, ethoxybenzene, methoxytoluene, lauryl methyl ether, stearic methyl ether, etc.; amide such as stearic amide, benzoil amide, acetone amide, etc., maybe listed. In addition thereto, organic solvents such as ethylenegrycolmonoethylether, cyclohexanone, butylcellosolve, cellosolve acetate, etc., whose boiling point is in the preferable range, may be used.

Oils such as linseed oil, soybean oil, poppy oil, safflower oil, etc., which are constituents of printing ink, and plasticizing agents such as tributyl phosphate, trichlesyl phosphate, dibutylphthalate, butyl laurate, dioctylphthalate, paraffin wax, etc., may be listed.

Also, ester of long-chain fatty acid and long-chain monovalent alcohol, that is, wax is hydrophobic and has a low melting point, and it is a preferable low molecular organic compound that is dissolved by heat generated by irradiation of light in the vicinity of particulates with an opto-thermal converting property and makes the area hydrophobic. Wax that melts at 50 through 200° C. is preferable. As the examples, any one of carnauba wax, custer wax, microcrystalline wax, paraffin wax, shellac wax, palm wax, and beeswax may be used, depending on the raw material. In addition to the wax, a particulate dispersoid of salt metal of solid acids such as oleic acid, stearic acid, palmitic acid, etc., and long-chain fatty acid such as silver hebenate, calcium stearate, magnesium palmitate, etc., may be used.

Perfluoro compounds of organic low molecular compounds are favorable since they can effectively perform a hydrophobic process. Preferable perfluoro compounds are as follows:

Perfluoro aliphatic carbonate such as perfluoro acetate, perfluoro butyrate, perfluoro valerate, perfluoro caprate, perfluoro heptanonate, perfluoro caproate, perfluoro caprate, etc.; perfluoro hydrocarbon such as perfluoro hexane, perfluoro octane, perfluoro tripropyl amine, perfluoro tributyl amine, perfluoro hexyl ether, perfluoro dodecane, etc.; perfluoro aliphatic alcohol such as perfluorobutanol, perfluoropentanol, perfluoro hexanol, perfluoro octanol, perfluoro dodecyl alcohol, etc.

2) Organosilicon Compounds

A preferable organosilicon compound is a hydrophobic processing agent that effectively makes hydrophobic the surface of a layer, which contains hydrophilic and lipophilic materials of an original printing plate. Organopolysiloxane, organosilane, and silicon compounds containing fluorine may be listed as the organosilicon compounds used for the object.

a. Organopolysiloxane

Organopolysiloxane is a compound represented by dimethylsilicone oil, methylphenylsilicone oil. In particular, organopolysiloxane whose degree of polymerization is 12 or less is preferable. In the preferable organosiloxane, 1 or 2 organic groups are bound per binding unit of siloxane, and the organic groups are alkyl and alkoxy whose carbon number is 1 through 18, alkenyl and alkynyl whose carbon number is 2 through 18, aryl whose carbon number is 6 through 18, aralkyl whose carbon number is 7 through 18, and alicyclic group whose carbon number is 5 through 20.

Also, in these organic substitution groups, halogen atoms, carboxyl, and hydroxy groups may be substituted. Further, in the abovementioned aryl, aralkyl and alicyclic groups, low-grade alkyl groups such as methyl, ethyl or propyl group may be further substituted in the range of the abovementioned carbon number.

Detailed examples of preferable organosilicon compounds that can be used for the invention are the following. However, the invention is not limited to the following.

The preferable polyorganosiloxane is polyorganosiloxane, whose degree of polymerization is 2 through 12, preferably 2 through 10, containing, as a repetition unit, at least one of (1) dialkylsiloxane group having alkyl whose carbon number is 1 through 5, (2) dialkoxysiloxane group having alkoxy whose carbon number is 1 through 5, (3) alkoxyphenylsiloxane group having alkoxy and phenyl whose carbon number is 1 through 5, and (4) ethoxymethoxysiloxane or methyethoxysiloxane group. The end group thereof is alkyl, amino group, hydroxy whose carbon number is 1 through 5, hydroxalkyl whose carbon number is 1 through 5, or alkoxy whose carbon number is 1 through 5. A further preferable end group is methyl, ethyl, isopropyl, n-propyl, n-butyl, t-butyl, methoxy and ethoxy.

Among them, a further preferable siloxane compound is dimethylpolysiloxane whose degree of polymerization is 2 through 10, dimethylsiloxane-methylphenylsiloxane copolymer whose degree of polymerization is 2 through 10, dimethylsiloxane-diphenylsiloxane copolymer whose degree of polymerization is 2 through 8, and dimethylsiloxane-monomethylsiloxane copolymer whose degree of polymerization is 2 through 8, wherein the end of polysiloxane compound is trimethylsilane group. In addition thereto, 1,3-bis(3-aminopropyl)teramethyldisiloxane, 1,5-bis(3-aminopropyl)hexamethyltrisiloxane, 1,3-dibutyl-1,1,3,3-tetramethyl-disiloxane, 1,5-dibutyl-1,1,3,3,5,5-hexaethyltrisiloxane, 1,1,3,3,5,5-hexaethyl-1,5-dichlorotrisiloxane, 3-(3,3,3-trifluoropropyl)-1,1,3,3,5,5,5-heptamethyltrisiloxane, decamethyltetrasiloxane, etc., may be listed.

A so-called silicone oil is available as a universal compound that is particularly preferable. Dimethyl silicone oil (as an article available on the market, for example, Silicone KF96 (produced by Shin-Etsu Chemical Co., Ltd.), methylphenyl silicone oil (as an article available on the market, for example, Silicone KF50 (produced by Shin-Etsu Chemical Co., Ltd.), methyl hydrogen silicone oil (as an article available on the market, for example, Silicone KF99 (produced by Shin-Etsu Chemical Co., Ltd.) may be listed.

b. Organosilane

As an organosilane compound that can be used as a hydrophobic processing agent, silane compounds such as n-decyltrimethoxysilane, n-decyltri-t-buthoxysilane, n-octadecyltrimethoxysilane, n-octadecyltriethoxysilane, dimethoxydiethoxysilane, etc., may be listed.

c. Organosilicon Compound Containing Fluorine

Silane, silanol and siloxane compounds having a fluorine-contained organic group as a substitution group may be used as a hydrophobic processing agent.

As preferable organosilicon compounds containing fluorine, the following may be listed, that is, silane, silanol, and siloxane compounds having, as an organic substitution group, polyfluoroalkyl (3,3,3-trifluoropropyl, trifluoromethyl, trifluorobutyl, trifluoroethyl, trifluoropentyl, 3,3,4,4,5,5,6,6,6-nonafluorohexyl), trifluoroacyloxy (trifluoroacetoxy, 2,2,2-trifluoroethoxy), trifluoroacyl (trifluoroacetyl), trifluoroalkylsurfone (trifluoromethan-surfone, 3,3,3-trifluoropropylsurfone).

The detailed examples are methyl-3,3,3-trifluoropropyl-dichlorosilane, trimethylsilyltrifluoromethansurfonate, trifluoroacetoxytrimethylsilane, 3,3,4,4,5,5,6,6,6-nonafuluorohexyltrichlorosilane, dimethoxymethyl-3,3,3-trifluoropropylsilane, 3,3,3-trifluoropropylsilane-trimethoxysilane, 3,3,4,4,5,5,6,6,6-nonafluorohexylmethyldichlorosilane, 3-trifluoroacetoxytrimethoxysilane, 1,3,5-tris(3,3,3-trifluoropropyl)-1,3,5-trimethylcychlotrisiloxane, 1,3,5,7-tetrakis (3,3,3-trifluoropropyl)-1,3,5,7-tetramethylcychlotetrasiloxane, 1,1,3,5,5-penta(3,3,3-trifluoropropyl)-1,3,5-trimethyltrisiloxane, 1,1,3,5,7,7-hexa(3,3,3-trifluoropropyl)-1,3,5,7-tetramethyl tetrasiloxane, methyl-3,3,3-trifluoropropylsilanediol, 3,3,4,4,5,5,6,6,6-nonafluorohexylsilanetriol, 3,3,4,4,5,5,6,6,6-nonafluorohexylmethylsilanediol, pentafluoroethoxysilanetriol, trifluoromethylsilane triol, and 3,3,3-trifluoropropylothoxysilanetriol.

Preferable compounds are methyl-3,3,3-trifluoropropyl-dichlorosilane, 3,3,4,4,5,5,6,6,6-nonafluorohexyltrichlorosilane, 3,3,3-trifluoropropylsilane-trimethoxysilane, 3,3,4,4,5,5,6,6,6-nonafluorohexylmethyldichlorosilane, 1,3,5-tris(3,3,3-trifluoropropyl)-1,3,5-trimethylcychlotrisiloxane, methyl-3,3,3-trifluoropropylsilanediol, 3,3,4,4,5,5,6,6,6-nonafluorohexylsilanetriol, 3,3,4,4,5,5,6,6,6-nonafluorohexylmethylsilanediol, pentafluoroethoxysilanetriol, trifluoromethylsilane triol, and 3,3,3-trifluoropropylothoxysilanetriol.

These organosilicon compounds are available on the market. For example, they are obtained from Shin-Etsu Chemical Co., Ltd. It is possible to obtain silanol by hydrolyzing chlorosilane that has been obtained, or to compose polyorganosiloxane by hydrolysis condensation.

3) Organic Macromolecular Compounds

Preferable macromolecular compounds that meet the abovementioned conditions of solubility or water absorption are soluble with coexisting low molecular organic compounds or hydrophobic macromolecular compounds that are themselves thermally plasticizable. For example, the following may be listed. That is, polyvinyl chloride, polyvinyl acetate, polyvinyl phenol, polyvinyl phenol halide, polyvinyl formal, polyvinyl acetal, polyvinyl butyral, polyamide, polyurethane, polyurea, polyimide, polycarbonate, epoxy resin, phenol, novolac or condensation resin of resolphenol and aldehyde or ketone, and polyvinylidene chloride, polystyrene, acryl-based copolymer resin, etc.

One of preferable compounds is not necessarily thermoplastic, but is phenol novolac resin or resol resin for organic low molecular compounds. That is, they are novolac resin or resol resin of condensation with formaldehyde such as phenol, cresol (m-cresol, p-cresol, m/p mixed cresol), phenol/cresol (m-cresol, p-cresol, m/p mixed cresol), phenol denatured xylene, tert-butylphenol, octylphenol, resorcinol, pyrogallol, catechol, chlorophenol (m-Cl, p-Cl), bromophenol (m-Br, P—Br), salicylic acid, phloroglucinol. In addition thereto, condensation resins of the abovementioned phenol compounds and acetone may be listed.

As other preferable compounds, polymers and copolymers that usually have a molecular weight of 10,000 through 200,000 with the monomers shown in (A) through (L) below employed as a composition unit may be listed. In the case of copolymers, the composition ratio may be optional as far as they are copolymerizable and one of the copolymers is hydrophobic.

(A) Acryl amide having aromatic hydroxyl, methacryl amide, ester acrylate, ester methacrylate, and hydroxy-styrene, for example, N-(4-hydroxyphenyl)acryl amide or N-(4-hydroxyphenyl)methacryl amide, o-, m- and p-hydroxystyrene, o-, m- and p-hydroxyphenyl acrylate or methacrylate.

(B) Ester acrylate having aliphatic hydroxy, ester methacrylate, for example, 2-hydroxyethylacrylate or 2-hydroxyethylmethacrylate.

(C) (Substitution) ester acrylate group such as methyl acrylate, ethyl acrylate, propyl acrylate, butyl acrylate, amyl acrylate, hexyl acrylate, cychlohexyl acrylate, octyl acrylate, phenyl acrylate, benzyl acrylate, acrylate-2-chloroethyl, acrylate4-hydroxybutyl, glycidy acrylate, and N-dimethylaminoethyl acrylate, etc.

(D) (Substitution) ester methacrylate group such as methyl methacrylate, ethyl methacrylate, propyl methacrylate, butyl methacrylate, amyl methacrylate, hexyl methacrylate, cychlohexyl methacrylate, octyl methacrylate, phenyl methacrylate, benzyl methacrylate, methacrylate-2-chloroethyl, methacrylate4-hydroxybutyl, glycidy methacrylate, and N-dimethylaminoethyl methacrylate, etc.

(E) Acrylamide or methacrylamide group such as acrylamide, methacrylamide, N-methylol acrylamide, N-methylol methacrylamide, N-ethyl acrylamide, N-ethyl methacrylamide, N-hexyl acrylamide, N-hexyl methacrylamide, N-cyclohexyl acrylamide, N-cyclohexyl methacrylamide, N-hydroxyethyl acrylamide, N-hydroxyethyl methacrylamide, N-hydroxyethyl acrylamide, N-hydroxyethylmethacrylamide, N-phenyl acrylamide, N-phenyl methacrylamide, N-benzyl acrylamide, N-benzyl methacrylamide, N-nitrophneyl acrylamide, N-nitrophenyl methacrylamide, N-ethyl-N-phenyl acrylamide, and N-ethyl-N-phenyl methacrylamide, etc.

(F) Vinyl ether group such as ethyl vinyl ether, 2-chloroethyl vinyl ether, hydroxyehtyl vinyl ether, propyl vinyl ether, butyl vinyl ether, octyl vinyl ether, phenyl vinyl ether, etc.

(G) Vinyl ester group such as vinyl acetate, vinyl chloroacetate, vinyl butylate, vinyl benzoate, etc.

(H) Styrene group such as styrene, methylstyrene, chlorostyrene, etc.

(I) Vinyl ketone group such as methyl vinyl ketone, ethyl vinyl ketone, propyl vinyl ketone, phenyl vinyl ketone, etc.

(J) Olefin group such as ethylene, propylene, isobutylene, butadiene, isoprene, etc.

(K) N-vinyl pyrrolidone, N-vinyl carbazol, 4-vinyl pyridine, acrylnitrile, methacrylonitrile, etc.

(L) Acrylamide group such as N-(o-aminosurfonylphenyl) acrylamide, N-(m-aminosurfonylphenyl)acrylamide, N-(p-aminosurfonylphenyl)acrylamide, N-[1-(3-aminosurfonyl)naphthyl)]acrylamide, N-(2-aminosurfonylethyl)acrylamide, etc.; methacrylamide group such as N-(o-aminosurfonylphenyl)methacrylamide, N-(m-aminosurfonylphenyl)methacrylamide, N-(p-aminosurfonylphenyl)methacrylamide, N-[1-(3-aminosurfonyl) naphthyl]methacrylamide, N-(2-aminosurfonylethyl) methacrylamide, etc.; unsaturated surfonamide such as ester acrylate groups such as o-aminosurfonyl acrylate, m-aminosurfonylphenyl acrylate, p-aminosurfonylphenyl acrylate, 1-(3-aminosurfonylphenyl naphthyl)acrylate, etc.; and unsaturated surfonamide such as ester methacrylate such as o-aminosurfonylphenyl methacrylate, m-aminosurfonylphenyl methacrylate, p-aminosurfonylphenyl methacrylate, 1-(3-aminosurfonylphenyl naphthyl)methacrylate, etc.

It is preferable that these organic macromolecular compounds have an average molecular weight of 500 through 20000 and a molecular weight of 200 through 60000 for several elements thereof.

Although the hydrophobic processing agent may be composed of only organic low molecular compounds, only organosilicon compounds, or macromolecular organic compounds, it may include two or three types thereof. Further, it may include the third element for the purpose of increasing the hydrophilicity of both elements.

In addition thereto, when providing a layer of a hydrophobic processing agent, an organic solvent such as ethyleneglycolmonoethyl ether, cychlohexanon, methylcellosolv, butylcellosolv, cellosolv acetate, 1,4-dioxane, dimethylformamide, acrylnitrile, etc., may be used to bring about a solution and a dispersion liquid.

(Method for Hydrophobic Processing)

Publicly known methods or systems such as a coating process, spraying process, vaporizing and condensing method, gas contacting method, immersing method, etc., maybe employed to provide a layer of a hydrophobic processing agent on the layer including hydrophilic and lipophilic materials.

a. Coating Process

The coating process is a method for applying a hydrophobic layer that is applicable to a liquid and solid-like hydrophobic processing agent. In a case where the hydrophobic processing agent is liquid, it may be directly coated, and in a case where it is solid-like, or in some cases where it is liquid, it may be dissolved in an adequate solvent or dispersed to make it into a liquid, whereby the coating process is carried out.

As a method for coating process, publicly known application developing methods such as a gravure coating method, reverse coating method, hopper coating method, slit coating method, etc., may be employed. Also, a sheet process is one of preferable methods, by which a hydrophobic processing agent is coated on an original plate via a medium carrying a hydrophobic processing agent to form a film. The method disclosed by Japanese Patent No. 2655337 may be listed as the method. Felt, fabric, slit and porous metal, etc., may be used as a medium carrying the hydrophobic processing agent. Among them, the method for coating a processing liquid by using sponge, which has been described in Japanese Unexamined Patent Publication Nos. 8-290088, 8-290087, and 9-138493 may be preferably employed.

A preferable amount of coating in the coating process is usually 10 through 100 ml per square meter, further preferably 15 through 50 ml per square meter, depending on the concentration of the hydrophobic processing agent.

b. Spraying Process

The spraying process is a method by which, as in the above description of the coating process, a hydrophobic processing agent which is made in to a liquid or dispersion liquid, or a hydrophobic processing agent solution is sprayed onto the surface of an original plate, whereby the surface is made hydrophobic. Also, the amount of spraying liquid is prepared more than the necessary amount of supply, wherein the surplus of the hydrophobic processing agent or the hydrophobic agent solution, which flows on the applied surface, may be re-circulated and reused. The spraying method and system of the hydrophobic processing agent or hydrophobic processing agent solution, number of nozzles, and shape thereof does not matter. Further, it may be sprayed by a single movable nozzle or a plurality of fixed nozzles. In addition, it may be sprayed by moving the nozzles with an original printing plate fixed, or by moving the original printing plate with the nozzles fixed. Among them, the method for spraying a hydrophobic processing agent or hydrophobic processing agent solution according to Japanese Unexamined Patent Publications Nos. 8-123001, 9-160208 and 9-179272 is particularly preferable, wherein an apparatus for a hydrophobic processing agent is employed, which has nozzles having a plurality of nozzle ports to spray a hydrophobic processing agent or a hydrophobic processing agent solution linearly arranged along the direction orthogonal to the transfer direction of original plates at a fixed interval, and an actuator for relocating the nozzles with respect to the original plates on the transfer channel.

c. Vaporizing and Condensing Method

The vaporizing and condensing method heats and vaporizes a sublimation solid hydrophobic processing agent, a volatile hydrophobic processing agent, and an easy-to-vaporize hydrophobic processing agent solution, wherein the vaporized agent or solution is brought into contact with the surface of an original printing plate, and a film of the hydrophobic processing agent is formed by condensing.

Organic compounds that have preferable effects for this method are organic compounds whose steam pressure is at least 1 mmhg at a temperature of 400° C. and is well stabilized at a temperature at which the steam pressure becomes 1 mmHg. That is, if an organic compound that has such steam pressure exists in a heated atmosphere, the distinction property between the hydrophilic property and hydrophobic property can be improved. Further preferably, the organic compounds are those whose steam pressure is at least 1 mmHg at a temperature of 300° C. and well stabilized at a temperature at which the steam pressure becomes 1 mmHg. Still further preferably, they are organic compounds, whose boiling points are 30 through 400° C., and which are well stabilized in a temperature range from 30 through 400° C., wherein the preferable boiling point is 50 through 350° C.

When heating the hydrophobic processing agent in order to vaporize the same, a container in which a hydrophobic processing agent is charged is placed in the outer casing of the heating section secured so as to be brought into contact with the surface of an original plate, and vapor or steam of the hydrophobic processing agent is caused to exist in the outer casing during the heating. Also, it is better that the heating is carried out in a state where paper, cloth, zeolite, or diatomaceous earth into which an organic compound is impregnated is inserted into the outer casing. One of the embodiments thereof will be described later.

d. Gas Contacting Method

In a case where the hydrophobic processing agent is a gas, or where it is the above described fluorine-contained organic compound, it is possible to make an original printing plate hydrophobic at a higher level by placing the original printing plate in an atmosphere containing the gas.

e. Immersing Method

The immersing method may be employed, by which an original printing plate is immersed in an immersing tank as has been usually performed.

[Image Formation by Heating and Irradiation of Activation Light]

On the original printing plate that has been entirely made hydrophobic, at least one of the heating and irradiation of activation light is carried out as per image, and the images are formed. As described above, as to embodiments of image formation, there are a method for heating the entire surface of the original plate and exposing activation light as per image, a method for heating as per image while irradiating activation light onto the entire surface at such an intensity that the original plate is not made hydrophilic, and a method for simultaneously carrying out the heating and irradiation of activation light on the basis of the same images.

(Heating an Original Plate when Irradiating Activation Light)

<Entire Surface Heating>

In the present invention, the temperature of an original plate is adjusted in a range from 40 through 200° C. when irradiating activation light. Effects of the invention are recognized in the range of temperature, by which the polarity changing rate is accelerated, and the distinguishing property is improved by strengthening of the hydrophilicity. At a temperature of 40 through 140° C., the effects become further remarkable. If the temperature is lower than 40° C., the effects are substantially lost, and if the temperature is more than 200° C., the distinction between imaged sections and non-imaged section is frequently lowered, and it is not practical.

Any of publicly known means may be employed as means for adjusting the temperature of an original plate in the above described range. However, as a preferable means for heating the same, the following may be available, that is, an electric heater in which nichrome wires and heat-generating resistors are used, a contact heating type heat roller that is combined with the electric heater in which nichrome wires and heat-generating resistors are used, infrared ray light, halogen light, tungsten light, solid laser for emitting infrared rays or semiconductor laser for emitting infrared rays (especially, in the case where the image recorded layer contains an opto-thermal converting agent), xenon discharge light, semiconductor laser for emitting light in the visible range (especially, in the case where the image recorded layer contains an opto-thermal converting agent), and opto-thermal converting type heat generating apparatus that emits flash light by discharge from a capacitor having a large capacitance.

Of them, the infrared ray laser, electric heater and infrared ray light are preferable in view of easy control of the temperature, a wide uniform heating area being secured, and inexpensive cost. Further, the method of light irradiation is preferable in view of simplicity in the apparatus structure and operation. If the light irradiation method is employed, as-per-image irradiation of activation light can be carried out together with light irradiation for heating, which can be served as as-per-image irradiation (overlapping exposure). In this case, it is preferable that the area irradiated by activation light enters the area irradiated by light for heating. A further detailed description is given of these methods with reference to FIG. 8 and FIG. 10 in the section of an apparatus described later.

When heating an original plate, the photo catalyst substance layer may be directly heated through a hydrophobic layer from the surface of the original plate. And, it may be indirectly heated from the rear side of the original plate or through the plate cylinder member and original plate substrate from the inside of the plate cylinder. A preferable method is such that a heating and temperature controlling apparatus is incorporated in a printing press and the temperature is controlled in interlock with the irradiation of light. An embodiment of the apparatus therefor will be described along with the examples with reference to FIG. 3, FIG. 5 and FIG. 6.

<Heating as per Image>

Any one of a method for heating due to opto-thermal conversion by heat waves brought about by an infrared ray laser and a method for heating due to contact transmission by a thermal head for printing may be used for heating an original plate as per image. It is preferable that the as-per image heating is carried out by scanning by either an infrared ray laser or a thermal recording head. In the scanning system, a linear scanning system or a two-dimensional scanning system using an array may be acceptable.

(Irradiation of Activation Light)

<Irradiation of Activation Light as per Image>

A description is given of the irradiation of activation light onto the surface, which is made hydrophobic, as per image.

The light source of activation light irradiated onto the surface of an original plate is a light source that emits light having a wavelength in a photosensitive range of a substance having photo catalyst power, that is, light of a wavelength equivalent to a light absorption range. For example, in a case where the substance having photo catalyst power is titanium oxide, a photosensitive range in the ultraviolet section is 387 nm or less as to an anatase type, 413 nm or less as to a rutile type, 387 nm or less as to a zinc oxide, and in a range of 250 nm through 390 nm as to many other metal oxides. Also, in the case of zinc oxide, it is possible to widen the applicable wavelength area of activation light by carrying out spectral intensification by an already known method in addition to the inherent absorption wavelength area (ultraviolet ray area) Therefore, the light source that is used is a light source, which emits light of these wavelength areas, and a light source that mainly emits ultraviolet rays.

Either of a surface exposure system and a scanning system may be available as a means for forming an as-per-image distribution of hydrophilic areas by a photo catalyst action of activation light.

The surface exposure system irradiates uniform light on an original plate through a mask image (for example, a lith type film on which a print document is developed), and makes the surface of the irradiated are a hydrophilic. If the substrate is transparent, it is possible to expose light from the rear side of the substrate through the substrate and mask image. The light source suitable to irradiate activation light in the surface exposure system is a mercury lamp, tungsten halogen lamp, other metal halide lamp, xenon discharge lamp, etc. The exposure time is determined by taking the light exposure illumination degree into consideration so as to obtain the above described exposure intensity.

Preferable intensity of the irradiation light differs according to the characteristics of an image forming layer of a photo catalyst type metal oxide, and differs according to the wavelength of activation light, a spectral distribution and light absorption ratio of the photo catalyst substance. However, usually, the surface exposure intensity before modulating by a mask image (for example, a developed lith-type film) is 0.01 through 100 $J/cm^2$, preferably 0.02 through 10 $J/cm^2$, and further preferably 0.05 through 5 $J/cm^2$.

In the case of the latter, that is, the scanning type exposure, a system is employed, in which instead of using the image mask, a laser beam is electrically modulated by an image, and an original plate is scanned. A publicly known laser that oscillates a beam of activation light may be used as the light source. For example, a helium cadmium laser having an oscillation wavelength of 325 nm as pumping light, a water-cooled argon laser having an oscillation wavelength of 351.1 through 363.8 nm, a zinc-surfide/cadmium laser having an oscillation wavelength of 330 through 440 nm, etc., maybe used. In addition, as to a gallium nitride lasers for which oscillation of an ultraviolet ray laser and a near-ultraviolet ray laser is confirmed, an InGaN base quantum well semiconductor laser having an oscillation wavelength of 360 through 440 nm and a waveguide $MgO$-$LiNbO_3$ inversion domain wavelength-converting type laser having an oscillation wavelength of 360 through 430 nm may be used. A laser whose output is 0.01 through 300 W is used for irradiation. In addition, in a case where a pulse laser is employed, it is preferable to irradiate a laser beam whose peak output is 1000 W, preferably 2000 W. When the substrate is transparent, exposure is enabled from the rear side of the substrate through the substrate.

<Irradiation of Activation Light onto the Entire Surface>

In a case where the heating is carried out as per image and the activation light is uniformly irradiated for exposure of the entire surface, the respective irradiating means that have been used for as-per-image irradiation of the above described activation light may be used. However, since it is not necessary to cause the activation light to carry image information, there is no need to modulate electric signals in compliance with the image information in the case of laser light and to provide any image mask in the case of uniform flash exposure. Further, in the case of laser scanning exposure, it is necessary to adjust the laser beam diameter so that substantially uniform energy light is given to the surface of an original plate.

Through the above described operations, the surface of the original printing plate having photo catalyst power is first made hydrophobic and next is provided with an image-like distribution of hydrophobic and hydrophilic areas upon receiving the irradiation of activation light in a heated state. Therefore, the original printing plate can be sent to an offset printing process without any development process.

Accordingly, the planographic printing method according to the invention has many advantages centering around the simplicity in comparison with usually publicly known planographic printing processes. That is, no chemical process using a developing solution by an alkali developing liquid as described above is required, and no wiping nor brushing in line therewith is required. Furthermore, since no waste developing liquid is generated, no environmental burden is brought about. Also, there is another advantage by which printing can be easily carried out by simplified means for recording images as described above.

[Printing Preparation]

Since the non-imaged sections of a planographic printing plate that is obtained from an original plate having photo catalyst power are made sufficiently hydrophilic, such a post-process may be carried out as necessary, by using wash water, a rinsing liquid containing a surface-activation agent, etc., a non-sensitive oil liquid including Arabian gum or starch derivative. As the post-process in the case where an image recording material according to the invention is used as a printing plate material, these processes may be combined for use.

The above described affinitizing agent is coated on a planographic printing plate by using sponge or absorbent cotton soaked with the same, or a printing master plate is immersed in a tray filled with an affinitizing liquid for coating the same thereon, or an automatic coater is used to coat an affinitizing liquid on the printing master plate.

Further, if the coating thickness is made uniform by using a squeegee or a squeegee roller after the affinitizing liquid is coated, a more favorable effect can be brought about. It is suitable that the coating amount of the affinitizing liquid is generally 0.03 through 0.8 g per square meter (in a dried state).

The planographic printing plate that has been obtained by these processes is applied to an offset printing press, etc., or is plate-processed in the printing press, wherein it is used for printing a number of sheets.

[Reproduction of a Printing Plate]

Next, a description is given of a reproduction process of the printing plate that has been used for printing once.

Ink is washed off from the printing plate, which has been used for printing, by using a hydrophobic petroleum based solvent. As the solvent, aromatic hydrocarbon, for example, kerosene, isoper, etc., is available as a printing ink solution on the market. In addition thereto, benzol, toluol, xylol, acetone, methylethylketone, and their mixed solvent may be used. If image substances are not dissolved, they are lightly wiped off by using rags. Also, there is a case where a 1-to-1 mixed solvent of toluene and dye-clean is effectively used.

Further, if the printing plate whose ink is removed by a dilute acid water solution of hydrochloric acid, sulfuric acid, etc. is washed, the history on the surface of the plate can be further completely erased.

The printing plate whose ink has been washed off and removed is initialized so that the past history does not adversely influence in the plate-making and printing processes when re-using the printing plate. The initialization may be carried out by uniformly raising the temperature of the entire surface of the printing plate to a temperature at which a hydrophilic property can be generated, or making the entire surface thereof hydrophilic by irradiating activation light on the entire surface thereof. The hydrophilic processing operation may be executed at any optional timing between the wash-off and removal of printing ink and the next plate-making process. In view of excluding the influence of the history during the custody of the original plate, it is preferable that the operation is carried out when re-using the original plate in the next plate-making process.

Although the number of times of repeated use of an original printing plate according to the invention is not completely understood, the number of times is at least 15 times or more, and it seems that the number of times is limited due to stains on the rear side, which cannot be removed, damages on the plate surface, whose repair is not practical, and mechanical deformation (strain) of the plate material.

III. Apparatus

Embodiment 1

Next, a description is given of a method and apparatus that carry out printing with the original plate mounted, with reference to the accompanying drawings.

The original printing plate having a photo catalyst substance on the surface thereof may be fixed as a component member of a plate cylinder or may be detachable. However, hereinafter, the description after FIG. 2 is based on the former case.

Figure 2:
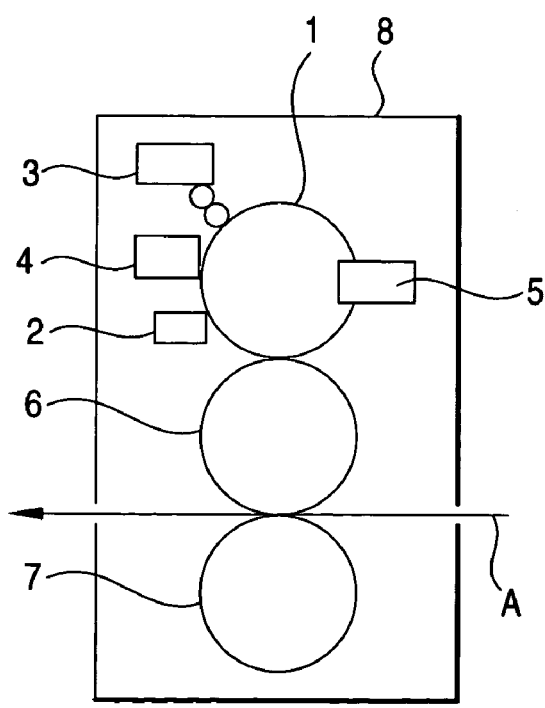
FIG. 2 is a view showing the construction of an offset printing press according to the first embodiment of the invention.

FIG. 2 is a view showing a construction of an offset printing press according to a first embodiment of the invention. The first embodiment is such that, after a hydrophobic layer is made on the surface of an original plate, activation light is irradiated as per image with the original plate heated, and the image is formed. As shown in FIG. 2, an offset printing press according to the first embodiment of the invention comprises a plate cylinder 1 on which an original printing plate having the above described catalyst power such as titanium oxide and zinc oxide; a hydrophobic processing section 2 for applying hydrophobic layer on the entire surface of the original plate; an activation light irradiating section 5 for heating the original plate, which is mounted on the plate cylinder 1 and is made hydrophobic on the entire surface thereof, to an appointed temperature, irradiating activation light as per image and for forming a hydrophilic and hydrophobic as-per-image distribution, in order to bring about a master plate (in the embodiment shown in FIG. 2, the heating section is included in a hydrophobic processing section 2 in view of heat economy); an ink and damping solution supplying section 3 for supplying ink and a damping solution to the master plate on the plate cylinder 1; an ink wash-off section 4 for removing ink remaining on the plate cylinder 1 after printing is completed; a blanket cylinder 6 acting as an intermediate means to transfer ink retained on the master plate on the plate cylinder 1 onto sheets of paper; and an impression cylinder 7 for retaining sheets of paper along with the blanket cylinder 6. These members are accommodated in the machine body 8. Further, in a case where surface exposure is carried out for image exposure, a film feeding section (not illustrated) is provided, which feeds lith-type films on which a printing document or image is printed and developed.

Figure 3:
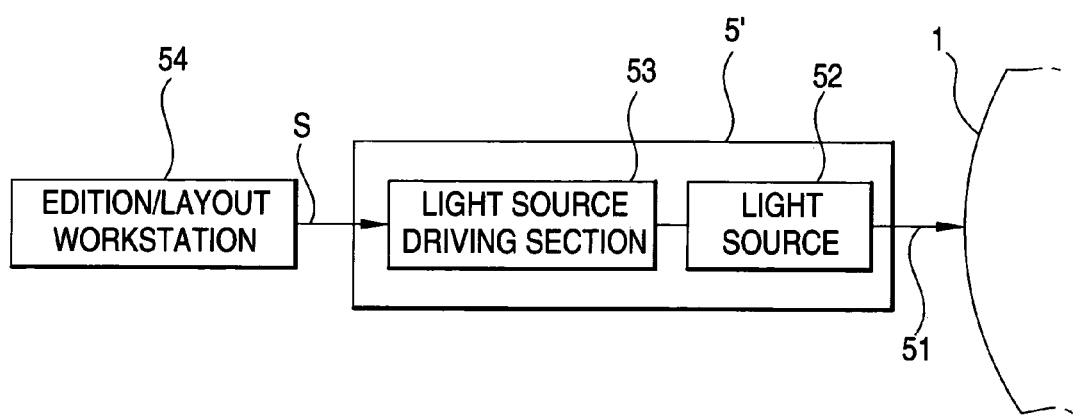
FIG. 3 is a view showing the construction of one mode of hydrophobic processing section by which a hydrophobic layer is applied by gas phase condensation.
Figure 5:
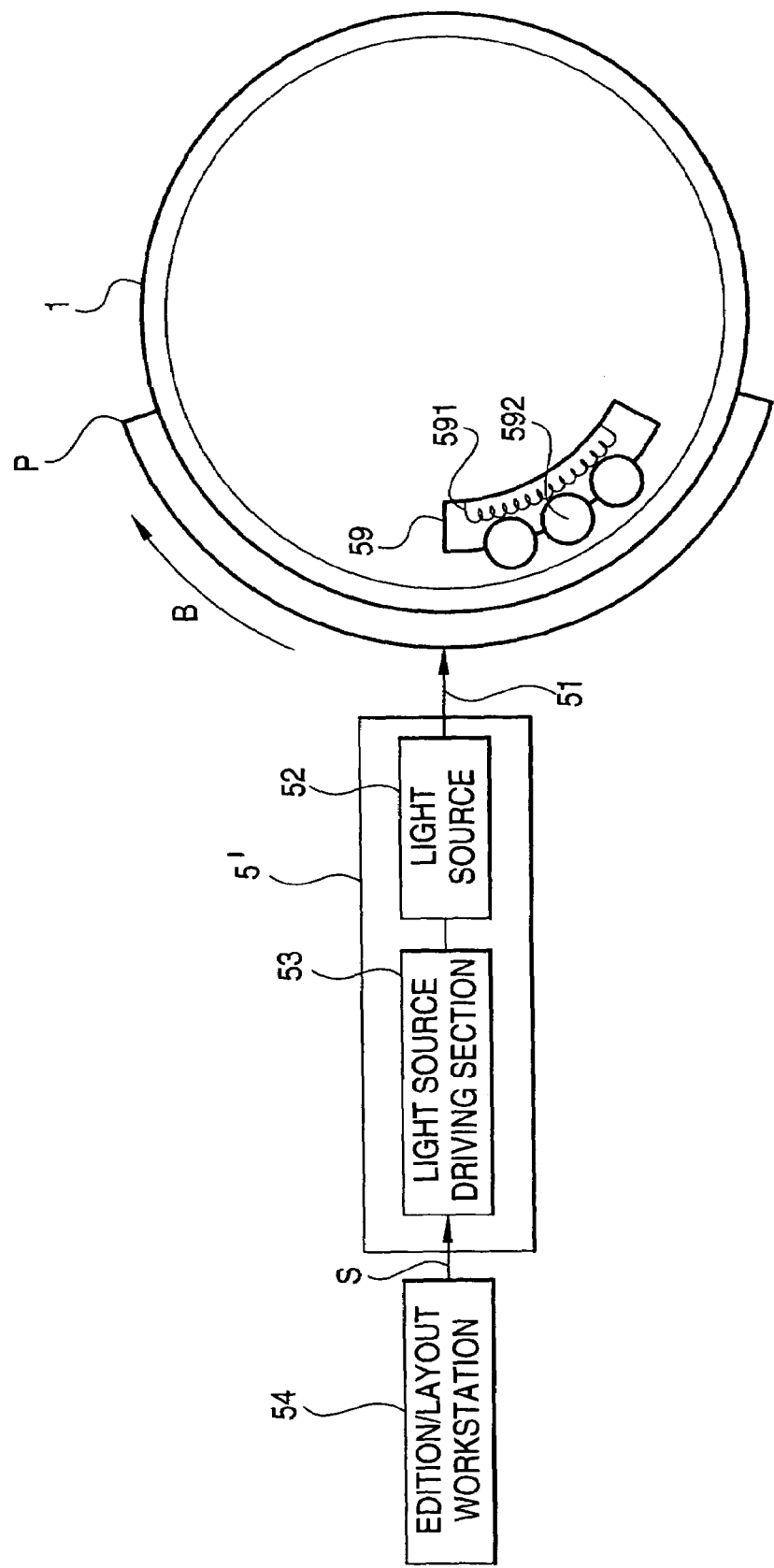
FIG. 5 is a view showing the construction of an activation light irradiating section of a laser depicting system that irradiates activation light along with the heating of an original plate through radiation.
Figure 6:
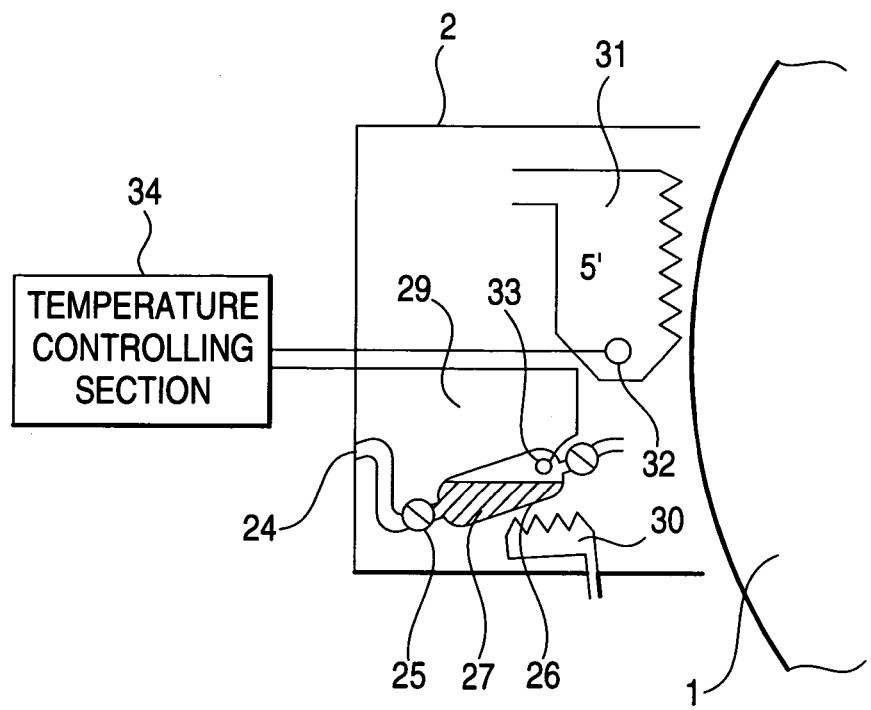
FIG. 6 is a view showing the construction of an activation light irradiating section of a laser depicting system that irradiates activation light along with the electro-contact heating of an original plate.

The hydrophobic processing section 2 makes the entire surface of an original plate hydrophobic by applying a hydrophobic processing agent onto the original plate. The hydrophobic processing means may be selected among a coating method by roller coating, reverse coating, dip coating, etc., a spraying method using a spray nozzle, a vapor condensing method, etc. Some modes thereof are shown in FIGS. 3, 5, and 6. For example, the hydrophobic processing section 2 shown in FIG. 2 is provided with an electric heater with a temperature controller. The hydrophobic processing agent is heated to a vaporizing temperature, supplied to the surface of the original plate, and condensed on the surface thereof, wherein a hydrophobic film is formed. Instead of the electric heater, heat wave heating may be employed by using an infrared ray light.

FIG. 6 is one mode of the hydrophobic processing section 2 that gives a hydrophobic layer of an organic compound, and is structured so that the hydrophobic layer can be provided on the surface of an original printing plate by condensation from an atmosphere containing a vaporized organic compound in an organic compound vapor supplying means 29. That is, in FIG. 6, the organic compound vapor supplying means 29 intakes air through its air inlet 24 and leads the air to a vaporizing chamber 26, in which a separatory funnel type glass tube having an inner diameter of 30 mm is horizontally arranged, through a cock 25. The vaporizing chamber 26 is filled with an organic compound 27 (shown with diagonal lines) so that the amount thereof becomes, for example, 50% in capacity, and a vaporized gas of the organic compound 27 is taken in by a necessary quantity, while air passes through the inside of the organic compound 27 and on the surface thereof, and it is led onto the surface of the plate cylinder 1.

The vaporizing chamber 26 inside the outer casing of the hydrophobic processing section 2 is heated by an electric heater 30, and the heating temperature is controlled by a temperature sensor 33 and a temperature controller 34 disposed in the vaporizing chamber 26.

Also, the vapor amount of intake of the organic compound 27 is a quantity by which a hydrophobic layer can be sufficiently formed at a vaporizing temperature set by the temperature controller 34. The temperature of the vaporizing chamber 26 is set so that the quantity can be obtained. It is enough that the temperature of the vaporizing chamber is normal, wherein it is enough to fill the under part of the vaporizing chamber with an organic compound 27, for example, in the case where the organic compound easily volatilizes and has a low boiling point (for example, methylethyl ketone and methyl cellosolv) with no heating required. However, in the case where the organic compound has a little higher boiling point than the above (for example, hexyglycol), such a measure is employed, in which diatomaceous earth, silica particles, zeolite, etc., having a large voidage are placed in the vaporizing chamber along with the organic compound 27, and the degree of contact between intake air and organic compound is increased.

Also, in the case where the organic compound 27 is a solid substance such as naphthalene, it is charged in the vaporizing chamber 26 at a suitable voidage. In the case where the organic compound 27 has a further higher boiling point, such a mechanism is employed, by which the internal temperature of the vaporizing chamber 26 is adjusted to a temperature suitable for vaporizing by the temperature controller 34, electric heater 30 and temperature sensor 33. For example, where a silicone oil is used, diatomaceous earth impregnated with a silicone oil is placed at the lower half portion of the glass tube, so as to be brought into contact with air, so that its capacity becomes 50%, the air temperature is a room temperature at its inlet port 24 and is heated by an electric heater 30 so that it rises to, for example, 170° C. during the passage through the insulator tube.

Also, although not illustrated, it is a matter of course that air containing vapor is discharged outdoors. As necessary, the air is purified before exhaust.

In the embodiment, the hydrophobic processing section 2 accompanies a heating means since it gives a hydrophobic layer by condensation from the gas phase, the hydrophobic processing section 2 incorporates an irradiation temperature controlling mechanism of the activation light irradiating section 5. The upper half section of FIG. 6 corresponds to the irradiation temperature controlling mechanism, and an original plate, onto the surface of which a hydrophobic layer is given, is heated by the electric heater 31, wherein the heating temperature is adjusted to an appointed temperature selected in a range from 40 through 200° C. by the temperature sensor 32 disposed in the heating area and the temperature controller 34. Activation light is irradiated onto the original plate, which is adjusted to the appointed temperature, as per image by an irradiation apparatus of the activation light irradiating section 5'.

Returning to FIG. 2, the activation light irradiating apparatus of the activation light irradiating section 5 employs a mercury lamp as a light source in the embodiment. However, it may be another light source containing ultraviolet ray components such as a xenon discharge light, a high illumination halogen/tungsten lamp, etc. Entire surface scanning exposure is carried out by slit light by slits disposed orthogonal to the direction of rotation of the plate cylinder through an image mask, that is, a lith-type film, which is provided on the surface of the plate cylinder in line with the rotations of the plate cylinder. The width of slits is not necessarily narrow, wherein the illumination, slit width and rotation speed of the plate cylinder are determined so that a hydrophilic and hydrophobic distribution as per image is formed on the surface of an original plate while passing through the activation light irradiating section 5. Instead of the slits, a so-called neck type lamp house, which has an irradiation width matched to the width of the plate cylinder, may be used.

As another mode of the activation light irradiating section 5, a system may be employed, which irradiates a laser beam carrying image information as activation light, instead of using a developed lith-type film as an image mask.

FIG. 3 shows the example, which shows a mode of as-per-image irradiation by a laser beam carrying image information. An activation light irradiating apparatus 5' (the portion of a depicting apparatus, excluding a heating device for heating an original plate to an appointed temperature, of the activation light irradiating section 5) of the activation light irradiation section includes a laser beam source 52 for emitting a laser beam 51 and irradiating it onto an original plate of the plate cylinder 1; and a laser beam source driving section 53, which drives the laser beam source 52, modulates the laser beam 51 and depicts an image on the original plate on the plate cylinder 1 on the basis of image signals S that are signalized from an image to be printed in an edition and layout workstation 54 and inputted into a recording section. The light source 52 is constructed so that it moves the emitted laser beam 51 relative to the plate cylinder 1 in the direction of the rotation axis of the plate cylinder 1 and scans the plate cylinder 1. By the rotation of the plate cylinder 1, and the surface of the plate cylinder 1 is exposed to the modulated laser beam 51, wherein the portions that are not irradiated by the laser beam 51 on the surface of the original plate on the plate cylinder 1 are made into hydrophobic image area while the portions that are irradiated by the laser beam are made into hydrophilic non-imaged areas. That is, negative type depicting can be carried out.

The laser beam 51 has oscillation wavelengths in the ultraviolet zone, visible zone and near-infrared zone, which are modulated by image information. In the embodiment, a helium cadmium laser is incorporated, and the laser beam 51 is irradiated directly on the surface of the plate cylinder. The surface of the original plate that is adjusted to an appointed temperature by light reaction resulting from the irradiation of the activation light is made hydrophilic. It is recommended that the laser beam 51 width is 30 μm, and the energy intensity is 10 mW through 10 W. Generally, it is preferable that the intensity is strong, wherein the irradiation will be completed in a shorter time in compliance with the intensity.

Also, if any laser oscillates activation light, a semiconductor laser, a solid laser, and other optional laser may be employed.

In addition, the system of directly modulating the laser is shown. However, it is a matter of course that the depicting can be carried out, in the same way as above, by a combination of the laser and peripheral modulation elements such as acoustic optical elements.

Figure 4:
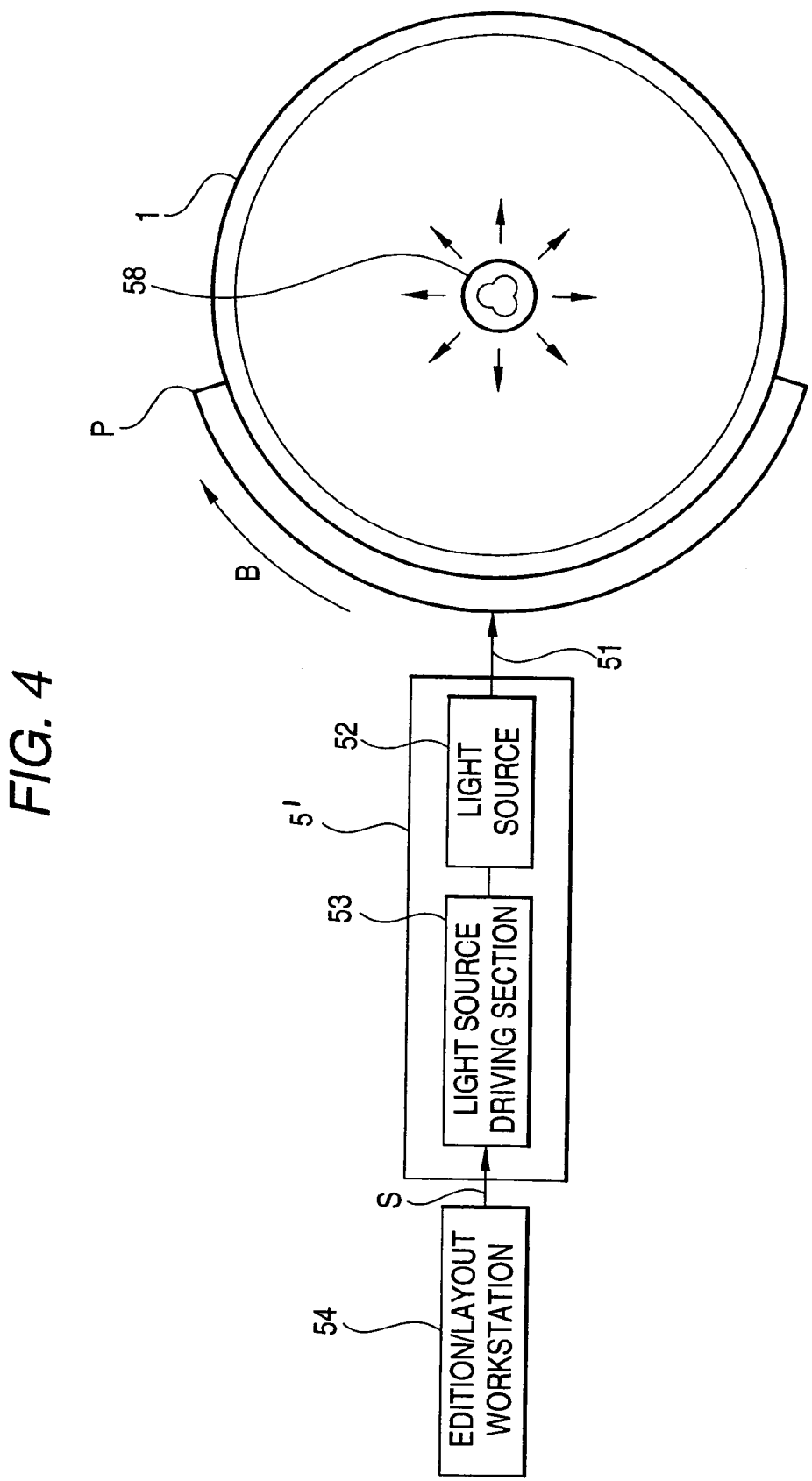
FIG. 4 is a view showing the construction of one mode of an activation light irradiating section.

Although the activation light irradiating section (5 in FIG. 2) includes an activation light irradiating apparatus 5' for irradiating activation light as per image, and a heating device for heating and adjusting the original plate temperature to an appointed temperature, there are several types of heating device. For example, a system for heating an original plate from the surface thereof as in the heating mode consisting of 31, 32 and 34 in FIG. 6, in which the heating device is connected to the hydrophobic processing section in view of heat economy, and a system of radiation heating or contact heating type, in which the heating is enabled from the substrate side of an original plate, that is, by a heating device attached inside the plate cylinder to an appointed temperature, may be promptly selected. FIG. 4 and FIG. 5 show the modes thereof.

FIG. 4 is a view showing a mode of the activation light irradiating section that carries out irradiation of activation light while heating an original plate from the inside of the plate cylinder to an appointed temperature. In FIG. 4, a heating device 58 installed in the plate cylinder is a tungsten halogen lamp, wherein an original plate is heated to an appointed temperature by heat waves. On the other hand, the left half section of FIG. 4 shows the activation light irradiating apparatus 5', which includes a laser beam source 52 for emitting a laser beam to an original plate, which is kept on an appointed temperature, as per image; an edition/layout workstation 54 that signalizes image information to be printed, and inputs it into a recording section as an image signal S; and a laser beam driving section 53 for modulating the laser beam 51 and driving the laser beam source 52 based on the image signal S. The mechanism and actions of the activation light irradiation apparatus 5' are the same as described above.

FIG. 5 is a view showing another mode of the activation light irradiating section that irradiates activation light while heating an original plate from the inside of the plate cylinder to an appointed temperature. In FIG. 5, a heating device 59 incorporated in the plate cylinder includes a heater 591 and a heating roller 592 that is heated in contact with the heater 591 and heats an original plate P via the plate cylinder 1. The original plate is heated to an appointed temperature by contact heating from the heating roller to the plate cylinder 1 and heat supplied to the original plate by transmission. On the other hand, the left half section in FIG. 5 is an activation light irradiation apparatus 5', which is the same as described above.

Next, a description is given of the operations of the first embodiment.

First, a hydrophobic layer of an organic compound vaporized by the heater 30 in the vaporizing chamber 27 in the organic compound substance supplying means 29 is given to the surface of an original plate on the plate cylinder 1, which passes through the hydrophobic processing section 2 while rotating, and the entire surface of the original plate is uniformly made ink-receivable. Subsequently, the temperature of the original plate is controlled in a range of the hydrophobic property generating temperature by the temperature controller section 34, and, upon receiving the irradiation of activation light, to which an as-per-image distribution is given via an image mask or is modulated by the image information in the activation light irradiating section 5', an image distribution having a hydrophilic property and a lipophilic property can be obtained, wherein the areas irradiated by the activation light are made hydrophilic while those not irradiated by the activation light are made lipophilic. When the irradiation of the activation light is completed, ink and a damping solution are next supplied to the plate cylinder 1 by the ink/damping solution supplying section 3. Thereby, ink is retained on lipophilic image areas of the original plate (printing master plate) on the plate cylinder 1, and a damping solution is retained on hydrophilic non-imaged areas with no ink retained there.

After that, a sheet of paper is fed between the blanket cylinder 6 and the impression cylinder 7 as shown by the arrow A, wherein the ink retained on the plate cylinder 1 is transferred to the sheet of paper via the blanket cylinder 6, thereby enabling offset printing.

After the printing is completed, ink remaining on the printing master plate on the plate cylinder 1 is removed by the inkwash-off section 4. After that, by heating the entire surface of the plate cylinder 1 through the hydrophobic processing section 2 to such a temperature that the photo catalyst substance presents a hydrophobic property, the history in the as-per-image hydrophilic areas of the printing plate on the plate cylinder 1 is erased, and the printing master plate is returned to an original plate before commencing the plate-making process.

Thus, according to the offset printing press of the present invention, it is possible to form a printing image on the original plate at an adequate depicting rate by only application of a hydrophobic layer on the entire surface of the plate and as-per-image irradiation of activation light onto the original plate whose temperature is adjusted, whereby offset printing with sharpness of printing surface is enabled without any development. Further, since it is possible to restore the plate cylinder 1 and printing master plate to their original state by heating the entire surface thereof after rinsing the plate cylinder 1 and printing plate, the reproduced original plate can be repeatedly used, wherein printed matters can be provided at a cheap cost. In addition, since it is not necessary to detach the plate cylinder 1 from a printing press, no foreign substance is permitted to be attached to the printing plate when incorporating it in a printing press as in conventional PS plates, thereby improving the printing quality.

Also, since an original printing plate is attached onto the plate cylinder 1, and the hydrophobic layer applying section 2, ink/damping solution supplying section 3, inkwash-off section 4, and activation light irradiating section 5 are disposed around the plate cylinder 1, it is possible to make the entire surface is of the original plate hydrophobic, irradiate activation light as per image, supply ink and a damping solution, and further wash off ink after printing is completed, wherein the entire system can be simplified and is made compact, and the space can be saved.

Further, among negative-type simplified plate-making systems, the present invention, in which activation light is irradiated as per image at an appointed temperature after making the entire surface of an original printing plate hydrophobic, has various advantages (1) a sufficient depicting rate can be obtained so as not to limit the productivity in the plate-making process, (2) a clear distinction can be obtained between imaged areas and non-imaged areas, and (3) the plate-making cost can be remarkably saved, in comparison with the system in which activation light is directly irradiated as per image without controlling the temperature at an appointed temperature. The invention has still further advantages (1) hydrophobic surface having high uniformity can be obtained, (2) as-per-image irradiation of activation light can be carried out immediately after hydrophobic process, and (3) reproduction is satisfactory, which is not influenced by the history of images, etc., in comparison with the system in which activation light is directly irradiated as per image without giving any hydrophobic layer. Resultantly, it is possible to make printing plates having clear distinction between image areas and non-imaged areas at a higher reproduction capability.

Embodiment 2

Figure 8:
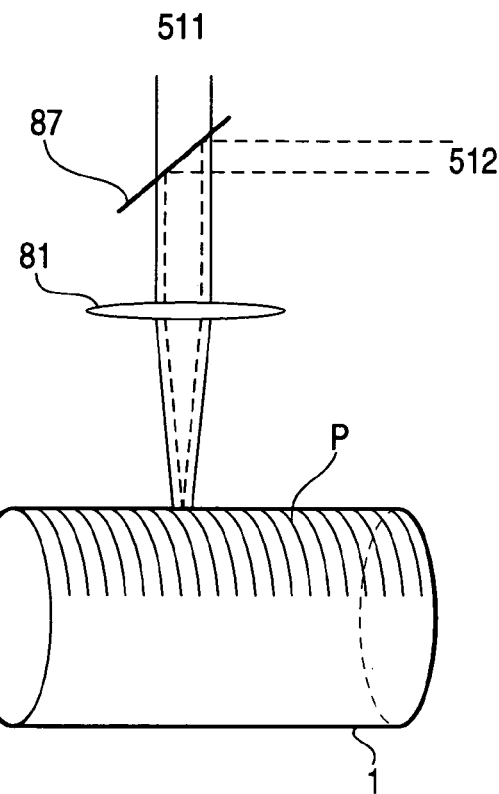
FIG. 8 is an exemplary view showing the overlap of both laser beams of the activation light and heating light in one example of the invention.
Figure 10:
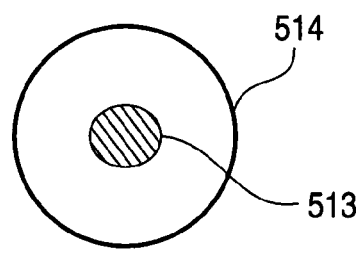
FIG. 10 is an exemplary view showing preferable overlap of the beam spots of both laser beams of activation light and heating light in one example of the invention.

Next, a description is given of the second embodiment of a printing press and a printing method according to the present invention. The second embodiment is a mode in which both irradiation of activation light and heating of the surface of an original plate are carried out by an optical scanning system. All the others are identical to those described with respect to the first embodiment. The mode shown in FIG. 8, in which a laser beam is employed, is used for irradiation of activation light and irradiation of heating light. An infrared ray beam may be employed in the case of the entire surface irradiation (the above described method (1)) not depending on any image distribution or in the case of irradiation as per image (the above described method (3)). However, in the latter case, the activation light and infrared ray beam carry the same image information. FIG. 8 is a rough exemplary view showing the mode in which an activation light laser beam for converting a polarity and an infrared ray laser beam for heating are simultaneously irradiated on the same position, wherein scanning exposure is carried out while the activation light irradiation laser beam 511 and laser beam 512 for heating are being irradiated on a original printing plate P attached onto the plate cylinder 1 so that the beam spots, condensed by a lens 81, of the activation light irradiation laser beam 511 and laser beam 512 for heating overlap each other. It is not necessary to cause the beam spots of the activation light 511 and heating light 512 to accurately overlap each other. It is better that the irradiation is carried out so that the beam spot of the activation light 511 enters the scope of the beam spot of the heating light 512. FIG. 10 is a view showing the relationship between the irradiation spots of such activation light and heating light, wherein the beam spot 513 of the activation light is concentrically irradiated in the beam spot 514 of the heating light. If irradiation is performed in such an overlapping relationship, the irradiation area of the activation light has a uniformly high sensitivity in the entire spot, wherein a hydrophilic process can be securely performed, and the heating area therearound is not made hydrophilic, and the heat can be immediately released.

EXAMPLE 1

An example of the embodiment 1 is shown below.

The surface of an aluminum rolled plate 0.3 mm thick, according to JIS A1050, which includes aluminum 99.5% by weight, copper 0.01% by weight, titanium 0.03% by weight, iron 0.3% by weight, and silicon 0.1% by weight, was grained by using a water suspension including 400-mesh Parmiston (made by Kyoritsu Ceramic Materials Co., Ltd) at a ratio of 20% by weight, and a rotary nylon brush (6,10-nylon). After that, the surface was washed off, using water.

The aluminum rolled plate was immersed in a 15%-by-weight sodium hydroxide water solution (including aluminum at a ratio of 4.5% by weight) and was etched so that the amount of aluminum solubility becomes 5 g per square meter. After that, it was washed with streaming water. Furthermore, the surface was neutralized by nitric acid 1% by weight. Next, an electrolytic roughing process was carried out in a 0.7%-by-weight nitric acid water solution (including aluminum 0.5% by weight) at an anodic electric amount of 160 Coulombs/dm$^2$ by using a rectangular wave alternation wave type voltage (current ratio r=0.90, electric current wave described in the embodiment of Japanese Patent Publication No. 58-5796) having an anodic voltage 10.5 volts and a cathodic voltage 9.3 volts. After washing off, the rolled aluminum plate was immersed in a 10%-by-weight sodium hydroxide water solution at 35° C., and was etched so that the solubility amount of aluminum becomes 1 g per square meter. After that, it was washed, using water. Next, it was immersed in a 30%-by-weight sulfuric acid water solution at 50° C. to make a death mat. After that, it was washed off, using water.

Further, a porous anodic oxidization film-forming process was carried out in a sulfuric acid 20%-by-weight water solution (including aluminum 0.8% by weight) at 35° C., using a direct current. That is, electrolysis was carried out at the current density of 13 A/dm$^2$ to make the weight of an anodic oxidization film 2.7 g per square meter by adjusting the time of electrolysis.

After the substrate was washed, using water, it was immersed in a water solution of sodium silicate 3% by weight at 70° C. for 30 seconds, and was washed and dried.

As to the aluminum substrate that has been obtained as described above, the reflection density measured by a Macbeth RD 920 reflection densitometer was 0.30, and the mean roughness of the centerline was 0.58μ.

Next, the aluminum substrate was placed in a vacuum vapor deposition device, and a titanium oxide thin film was formed by vapor deposition of a titanium metal piece onto the aluminum substrate by electrically heating the titanium metal piece under the condition of oxygen gas whose partial pressure is 70% so that the entire pressure becomes $2.0 \times 10^{-2}$ Pa. The crystalline constituents of the thin film were such that the ratio of the amorphous/anatase/rutile crystalline structure according to an X-ray analysis method is 1.5/6.5/2, and the thickness of TiO$^2$ thin film was 900 angstroms. This was wound on the base of the plate cylinder 1 to use it as an original plate for printing in a press. The contact angle of the surface of the original printing plate with respect to water was measured by an airborne pendant-drop method using the Contact Angle Meter CA-D (made by Kyowa Interface Science Co., Ltd), wherein the contact angle was between 48 and 55 degrees at any point. The original printing plate was attached on the plate cylinder (1 in FIG. 2) of a printing press shown in FIG. 2.

Using a heating portion of such a mode as shown in FIG. 3, perfluoro butyric acid (available on the market as a reagent) was filled in a vaporizing chamber (26 in FIG. 3) to approx. 50% of the capacity thereof, and heating was carried out by electric heating whose heating temperature is controlled to 100° C. The plate cylinder was rotated at a rotation speed by which the time of passage of the heating section becomes 1 minute. After the heating is completed, the contact angle of the surface of the original plate with respect to water was measured by the airborne pendant-drop method using the Contact Angle Meter CA-D (made by Kyowa Interface Science Co., Ltd.), wherein the contact angle was between 85 and 91 degrees at any part. Also, the original plate was further heated by setting the temperature of the heater 31 to 14° C., and was sent to the activation light irradiation apparatus.

Next, in the activation light irradiating section 5 in FIG. 3, the plate cylinder was rotated at a rotation speed by which the time of passage becomes 10 seconds at a light intensity of 50 mW per square centimeter by using a light source device for printing US10 "UNIREC" URM600 type GH60201X (made by Ushio Inc.). The surface of the original plate was exposed to as-per-image irradiation of activation light through a developed film supplied from a film supplying device (not illustrated). After the irradiation, the contact angle of the surface of the original plate with respect to water was measured by the airborne pendant-drop method using the Contact Angle Meter CA-D (made by Kyowa Interface Science Co., Ltd.), wherein the contact angle was between 7 and 9 degrees at any irradiation area.

The printing plate on the plate cylinder 1 was used in a single-side printing press "Oliver 52" (made by Sakurai Corporation), and 2000 sheets of paper was planographic-printed by using pure water as a damping solution and Newchampion F Gross 85 Black (produced by DaiNippon Ink And Chemicals, Incorporated) in the ink/damping solution supplying section 3. Clear printed matters could be obtained from the commencement to the end, and no damage could be found in the plate cylinder 1.

Next, in the washing-off section 4, the surface of the printing master plate was carefully washed off by using rags soaked with a mixed solution of an ink washing-off liquid "Die Clean R" (made by DaiNippon Ink And Chemicals, Incorporated) and toluene at a ratio of 1 to 1 in order to remove ink. And it was heated to 100° C. in the hydrophobic processing section 2 with the vaporizing chamber removed. The contact angle was measured by the same method as described above. The contact angle was between 48 and 55 degrees at any portion on the printing master plate, and the surface of the printing master plate was restored to the same condition as the original plate.

Next, the plate-making process commencing from the above described hydrophobic processing was repeated on this original plate in the same conditions to prepare a printing master plate again.

The restored printing master plate on the plate cylinder 1 was used in a single-side printing press "Oliver 52" (made by Sakurai Corporation), and 1000 sheets of paper was planographic-printed by using pure water as a damping solution and Newchampion F Gross 85 Black (produced by DaiNippon Ink And Chemicals, Incorporated) in the ink/damping solution supplying section 3. Clear printed matters could be obtained from the commencement to the end, and no damage could be found on the plate cylinder 1.

The same procedure as described above was repeated five times, wherein no change could be recognized in the figure of the contact angle after irradiation of activation light, the restoration speed of the contact angle by heating, and clearness of the images on the printed surface.

Judging from the above described result, it was shown that printing based on the negative type plate preparation is enabled by using an original printing plate, in which a titanium layer is provided on an aluminum substrate, and giving a hydrophobic layer and irradiating activation light as per image at an appointed temperature by using a printing press according to the first embodiment, and moreover it was found that the original printing plate can be repeatedly used by only washing-off to remove ink and heating to erase the history on the surface of the original plate.

[Comparison Control 1]

In the first embodiment, the plate making and printing were carried out under the same conditions as those in the first embodiment other than activation light being irradiated where the temperature of the original plate is 30° C. after a hydrophobic layer was given without heating by the heater 31 in the hydrophobic processing section.

The printing result was such that the white section (non-printed section) is stained due to printing in all the printed matters from the commencement of printing to the end of printing, the ink density was low at the imaged sections, and no clear distinction could be obtained between the imaged sections and non-imaged sections, wherein only low-quality printing was obtained.

[Comparison Control 2]

The plate making and printing were carried out under the same conditions as those of the comparison control 1 other than the plate cylinder being rotated by changing the rotation speed so that the time of irradiation (passage) of imaging light becomes from 10 seconds to 30 seconds when performing scanning exposure in the activation light irradiating section 5.

The printing result was such that that stains in the white section (non-printed section) are remarkably reduced in all the printed matters from the commencement of printing to the end of printing, the ink density was increased to a permissible level, wherein, although the printing quality is clearly inferior to that of the first example, the printed matters were in a permissible range.

Judging from the first example and comparison controls 1 and 2, as to the comparison control 1, if the as-per-image exposure is carried out at a fast scanning speed (shorter time of light irradiation), which is favorable to the plate-making operation efficiency at a low temperature (30° C.) without adjusting the temperature of an original plate to an appointed temperature, no printable master plate can be obtained due to a delay in the image formation. As to the comparison control 2 in which the time of light irradiation is increased, although the printing quality is improved, a longer time of light irradiation is required. To the contrary, if the light irradiation is carried out in a state where the temperature of an original plate is heated to an appointed temperature, the photosensitivity is increased, wherein a clear distinction property can be effectively obtained in a short time.

EXAMPLE 2

A 100 microns thick stainless steel plate was set in a vacuum vapor deposition apparatus, and zinc was vapor-deposited to become 1,000 angstroms in thickness in a vacuum state whose entire pressure is 0.01 Pa. The stainless steel plate was oxidized in the air at a temperature of 600° C., thereby forming a thin film of zinc oxide on a single side of the stainless steel plate.

As in the first example, the stainless steel plate having a 100 microns thick zinc oxide film was wound on the base material of the plate cylinder 1 of a printing press of the first example to make it into an original plate that is used in a printing press. The contact angle of the surface of the original plate was measured with respect to water by an airborne pendant-drop method using the Contact Angle Meter CA-D (made by Kyowa Interface Science Co., Ltd.), wherein the contact angle was between 50 and 57 degrees at any point.

Using the same hydrophobic processing agent as that in the first example, a hydrophobic layer was formed on the surface of the original plate by electric heating for which the temperature in the vaporizing chamber was controlled to 100° C. as in the first example. The contact angle of the surface of the original printing plate with respect to water was measured by an airborne pendant-drop method using the Contact Angle Meter CA-D (made by Kyowa Interface Science Co., Ltd.), wherein the contact angle was between 86 and 92 degrees at any point.

Next, as in the first example, the temperature of the heater (31 in FIG. 3) was controlled so that the temperature of the original plate becomes 140° C. when irradiating activation light. The as-per-image irradiation of the activation light was carried out on the surface of the original plate through a developed film at a rotation speed so that the time of irradiation of the activation light becomes 10 seconds under the same conditions by using the US10 "UNIREC" URM600 type GH60201X (made by Ushio Inc.). After the irradiation, the contact angle of the surface of the original plate with respect to water was measured by the airborne pendant-drop method using the Contact Angle Meter CA-D, wherein the contact angle was between 10 and 13 degrees at any irradiation area.

The plate cylinder 1 was used in a single-side printing press "Oliver 52" (made by Sakurai Corporation), and 1000 sheets of paper was offset-printed by using pure water as a damping solution and New champion F Gross 85 Black (produced by DaiNippon Ink And Chemicals, Incorporated) in the ink/damping solution supplying section 3. Clear printed matters could be obtained from the commencement to the end, and no damage could be found in the plate cylinder 1.

Next, in the washing-off section 4, the surface of the plate cylinder 1 was carefully washed off by using rags soaked with a mixed solution of an ink washing-off liquid "Die Clean R" (made by DaiNippon Ink And Chemicals, Incorporated) and toluene at a ratio of 1 to 1 in order to remove ink. And it was heated, by electric heating, to 100° C. in the hydrophobic processing section 2 without being brought into contact with any organic compound vapor. The contact angle was measured by the same method as described above in a state where the temperature was cooled down to the room temperature. The contact angle was between 50 and 57 degrees at any portion on the printing plate.

Next, as-per-image irradiation of activation light was carried out on the surface of the original plate by using the US10 "UNIREC" URM600 type GH60201X. After the irradiation, the contact angle of the surface of the original plate with respect to water was measured by the airborne pendant-drop method using the Contact Angle Meter CA-D, wherein the contact angle was between 10 and 13 degrees at any irradiation area.

The plate cylinder 1 was used in a single-side printing press "Oliver 52" (made by Sakurai Corporation), and 1000 sheets of paper was planographic-printed by using pure water as a damping solution and Newchampion F Gross 85 Black (produced by DaiNippon Ink And Chemicals, Incorporated) in the ink/damping solution supplying section 3. Clear printed matters could be obtained from the commencement to the end, and no damage could be found in the plate cylinder 1.

Based on the result, it was found that printing could be carried out by the irradiation of activation light onto the entire surface and heat mode printing by using a printing press according to the mode 1 and using an original printing plate for which a zinc oxide layer is secured on the stainless steel substrate, and also, the original printing plate could be repeatedly used by only washing-off and removing the ink.

[Comparison Control 3]

In the second example, the plate making and printing were carried out under the same conditions as those in the first example other than activation light being irradiated where the temperature of the original plate was 30° C. after a hydrophobic layer was given without being heated by the heater 31 in the hydrophobic processing section.

The printing result was such that the white section (non-printed section) was stained due to printing in all the printed matters from the commencement of printing to the end of printing, the ink density was low at the imaged sections, and no clear distinction could be obtained between the imaged sections and non-imaged sections, wherein only low-quality printing was obtained.

[Comparison Control 4]

In the second example, the plate making and printing were carried out by the same operations as those in the first example other than the heating temperature of the original plate by the heater 31 being set to 210° C.

The printing result was such that the white section (non-printed section) was stained due to printing in all the printed matters from the commencement of printing to the end of printing, the ink density was low at the imaged sections, and no clear distinction could be obtained between the imaged sections and non-imaged sections, wherein only low-quality printing was obtained.

EXAMPLE 3

An aluminum substrate that was subjected to an anodic oxidization process as in the first example was immersed in a 20% ethanol solution containing cesium ethoxide, titanium butoxide, lanthanum isobutoxide, and niobium ethoxide by an amount equivalent to the stoichimetric ratio of $CsLa_2Nb$, wherein it was heated to 280° C. after hydrolyzing the surface, and a 1000 angstroms thick thin film of $CsLa_2NbTi_2O_{10}$ was formed on the surface of the aluminum substrate.

The same plate making, printing, ink washing-off and removal, and re-printing were carried out as in the first example, other than the aluminum substrate having the composite metal oxide thin film being wound on the base material of the plate cylinder to make it into an original plate.

The contact angle of the hydrophobically processed original plate with respect to water was between 85 and 90 degrees at the first and second times. Also, the contact angle of the irradiation area of activation light was between 10 and 14 degrees. The printing was free from any stain at both the first and second times with respect to the quality, and the distinction property between the imaged areas and non-imaged areas was sufficient.

[Comparison Control 5]

However, when activation light was irradiated at 30° C., the printed matters were remarkably stained, and no distinction could be obtained.

EXAMPLE 4

A 100 microns thick polyimide film (pyromellitic anhydride/m-phenylene diamine copolymer) (brand name: Capton, DUPONT-TORAYCO.,LTD.) was set in a vacuum deposition apparatus, and an original plate was produced, in which titanium dioxide was made into a thermal-response metal oxide. That is, the above described polyimide substrate was set in a spattering apparatus, and a titanium metal piece was heated under the conditions in which the partial pressure of oxygen was 70% at the total pressure of 1.5 mPa, in order to form a titanium dioxide thin film by vapor deposition. As for the crystalline constituents of the thin film, the structural ratio of amorphous, anatase and rutile crystals was 15/6.5/2 according to an X-ray analysis method. Also, the thickness of the titanium dioxide thin film was 90 nm. Then, the same plate making, printing, ink washing-off and removal, and re-printing as in the example 1 were carried out, except that the above original plate was wound on the base material of the plate cylinder and used as an original plate, and a tungsten halogen lamp was used as a light source of the activation light. The tungsten halogen lamp used herein was a 500 W studio lamp for photographing, which is available on the market.

After a hydrophobic layer was given thereto, the contact angle of the surface of the original plate with respect to water was between 86 and 92 degrees at the first and second times, and the contact angle of the activation light in the irradiation area was between 10 and 15 degrees, wherein the printing was free from any stain at both the first and second times, and sufficient distinction could be recognized between the imaged areas and non-imaged areas.

[Comparison Control 6]

However, where the activation light was irradiated at 35° C., the printed matters are remarkably stained, wherein no distinction could be obtained.

EXAMPLE 5

The printing plate was produced and printing was carried out in the same conditions as those of the example 1, excepting that, in the example 1, by using an argon laser instead of carrying out the irradiation of activation light as per image by the UNIREX URM600, and using the apparatus shown in FIG. 5 instead of using a developed lith-type film as an image mask, a laser ray beam is modulated based on image information and irradiated, while heating by heat waves (to 150° C.) of a tungsten halogen lamp (58 in FIG. 5) from the substrate side of the original plate, in order to give an as-per-image distribution. Furthermore, the printing plate was repeatedly used. The scanning was carried out where the irradiation conditions of the laser beam where the oscillation wavelength is 0.35 µm at and the beam diameter is 30 µm. Also, the beam intensity was 50 mW.

The contact angle of the hydrophilic area by the laser irradiation with respect to water was between 9 and 11 degrees at the first and second times, wherein the printing surface was free from any stain at both the first and second times, and the distinction property between the imaged areas and non-imaged areas was sufficient.

[Comparison Control 7]

However, where the tungsten halogen lamp is turned off and the activation light was irradiated at 35° C., the printed matters were remarkably stained, and no distinction could be obtained.

EXAMPLE 6

A boat-type coating squeezer is disposed in the hydrophobic processing section, and a silicone oil (Brand name: Silicone KF99 (made by Shin-Etsu Chemical Co., Ltd.)] is filled therein, wherein the plate cylinder is rotated in a state where the original printing plate on the plate cylinder is brought into contact with the silicone oil, and a hydrophobic layer of the silicone oil was given by dip coating. The figure of the contact angle of the surface of the hydrophobic layer with respect to water was between 90 and 96 degrees. Next, in a state where the original plate was heated to 190° C. by an electric contact heating type original plate heating device shown in FIG. 6, image information was recorded by the irradiation of a laser beam. The contact angle of the hydrophilic area, where activation light was irradiated as per image, with respect to water was between 9 and 11 degrees.

5000 sheets of paper were offset-printed by using the printing plate. The printed matters were free from any stain from the commencement to the end as in the example 1, and clear printed matters could be obtained. To the contrary, in comparison controls, one of which the temperature of the electric contact heating type original plate heating device was set to 35° C. instead of 190° C., and the other of which the temperature thereof was set to 210° C., remarkable stains occurred, and especially, where the temperature thereof was 210° C., almost no distinction was lost.

EXAMPLES 7 THROUGH 10

A printing plate was prepared by the same method as that in the example 6, excepting that silicone KF99 in the example 6 was changed to a 10%-by-weight methanol solution of organic compounds described in the above-mentioned (1) through (4) and irradiation of activation light was carried out while changing the temperature of the original plate to four levels, 35, 100, 180, and 210° C., and 2000 sheets of paper were printed. When the temperature was 100 or 180° C. when irradiating activation light, no ink stain could be recognized from the commencement of the printing to the end thereof, and clear printed matters could be obtained. When the temperature was 35 or 210° C. when irradiating activation light, ink stains could be found from the commencement of the printing to the end thereof, and the distinction property between the imaged areas and non-imaged areas was reduced.

EXAMPLE 11

A 20 microns thick film of silicon dioxide was formed on an aluminum substrate, onto which anodic oxidization was applied after the graining, chemical roughing, and electrolytic roughing described in the example 1 were applied, by an electro-deposition of sodium silicate, and the film was made into a heat insulating layer.

Next, a 2-micron-thick silicon (Si) layer was provided as a heat generating layer on the heat insulating layer by metal silicon spattering.

Next, the aluminum substrate that is provided with the heat insulating layer and heat generating layer was placed in a spattering apparatus, and a titanium metal target was set, wherein the gas pressure was adjusted to $5\times10^{-1}$ Pa so that the Ar/O2 ratio becomes 60/40 (molar ratio). After that, RF power 200 W was charged, and spattering was performed, whereby a titanium oxide thin film was formed on the aluminum substrate.

FIG. 9 is an exemplary view showing the construction of a planographic printing original plate according to the invention, which has thus been produced. In FIG. 9, a heat insulating layer 91 is provided on one side of a substrate 90 of original printing plate, and a heat generating layer 92 is further provided thereon. An image recording layer 92 is provided on the extremely upper layer, and is constructed so that it gives a change in polarity onto the surface of an original plate.

Subsequently, a silicone oil KF-99 (made by Shin-Etsu Chemical Co., Ltd.) was adhered on the entire surface of the photosensitive layer by the same method as that in the example 1. The contact angle of the surface of the hydrophobic film with respect to water was measured by the airborne pendant-drop method, using the Contact Angle Meter CA-D (made by Kyowa Interface Science Co., Ltd.), wherein the contact angle was between 78 and 85 degrees at any portion.

An ultraviolet ray laser (water-cooled argon laser) beam having a wavelength of 355 nm was irradiated onto the original plate as activation light. The conditions of irradiation of the laser beam are 350 nm for the oscillation wavelength and 30 µm for the beam diameter. Where a hydrophilic process was carried out by only the irradiation of activation light without using any laser beam for heating, the irradiation energy required to make the contact angle become 10 degrees was 700 mJ per square centimeter.

Next, where a YAG laser (irradiation energy is 300 mJ per square centimeter, and beam diameter is 30 µm) is used as a heating laser to irradiate the same area as the area that is irradiated by activation light at the same time, the irradiation energy required to reduce the contact angle to 10 degrees was 65 mJ per square centimeter and showed a reduction exceeding one digit. The area where the contact angle becomes 10 degrees was only the area where both the activation light and heating laser beam were irradiated. Simultaneous irradiation could reduce the irradiation energy of an ultraviolet ray to one-tenth in comparison with the case where the hydrophilic process was carried out by only the ultraviolet ray.

Embodiment 12

The irradiation of activation light according to the example 11 was carried out by changing the rotation speed of a drum scanner. In the case where the hydrophilic process was carried out by only the irradiation of activation light, the hydrophilic process was made till the contact angle of 10 degrees when the linear speed of the drum scanner was set to 50 cm per second. If the scanning exposure is carried out while irradiating a heating laser beam at the same time, it was possible to execute a hydrophilic process at a linear speed of 500 cm per second, which is larger by ten times.

EXAMPLE 13

The irradiation areas of the heating laser and activation light were disposed as in the relationship shown in FIG. 8 and FIG. 10, and the area that is irradiated by the activation light (511 in FIG. 8 and 513 in FIG. 10) was made narrower than the area that is irradiated by the heating laser light (512 in FIG. 8 and 513 in FIG. 10), wherein the amount of energy of the activation light required for the contact angle to become 10 degrees and the area where the contact angle becomes 10 degrees were investigated. The amount of the irradiation energy of the heating laser beam and the wavelength of the irradiation beam were made the same as those of the example 11. The wavelength of the irradiation beam of the laser beam of activation light was made the same as that of the example 11. Further, the other conditions were also made the same as those of the example 11, and a test was performed. As a matter of course, irradiation was carried out so that an area exists, in which the irradiation density of a laser beam becomes a density at which a water drop contact angle can be measured. The irradiation energy of activation light necessary for the contact angle to become 10 degrees was 65 mJ per square centimeter, and the area where the contact angle became 10 degrees was only the area that was irradiated by the activation light.

EXAMPLE 14

As the relationship opposed to the example 12 in which the areas irradiated by the heating laser beam and activation light were disposed as in the relationship shown in FIG. 8 and FIG. 10 (that is, the area irradiated by the activation light was made wider than the area irradiated by the heating laser beam), the amount of energy of the heating light required for the contact angle to become 10 degrees and the area at which the contact angle becomes 10 degrees were investigated. The amount of irradiation energy of the laser light for activation was set to 65 mJ per square centimeter while the wavelength of the irradiation light was made the same as that of the example 11. Further, the wavelength in the irradiation of the heating laser beam was made the same as that of the example 11. Still further, the other conditions were made the same as those of the example 11, and a test was carried out. As a matter of course, irradiation was carried out so that an area exists, in which the irradiation density of a laser beam becomes a density at which a water drop contact angle can be measured. The irradiation energy of heating light necessary for the contact angle to become 10 degrees was 300 mJ per square centimeter, and the area where the contact angle became 10 degrees was only the area that was irradiated by the heating light.

As has been made clear on the basis of the results of the examples 11 through 14, even if any one of the method for irradiating both activation light and heating light as per image, method for irradiating only the activation light as per image and irradiating an area, which is wider than the area irradiated by the activation light, by the heating light, and method for irradiating the heating light as per image and irradiating an area, which is wider than the area irradiated by the heating light, by the activation light is used, it is directly or indirectly shown that an effective change in polarity occurs by a slighter irradiation energy of activation light than in the case of irradiation of activation light not accompanying the heating. Under this condition, a printing plate can be obtained, which has a higher distinction property between imaged areas and non-imaged areas, whereby an excellent printing method can be brought about.

Next, a description is given of the third embodiment of the invention.

Embodiment 3

Figure 7:
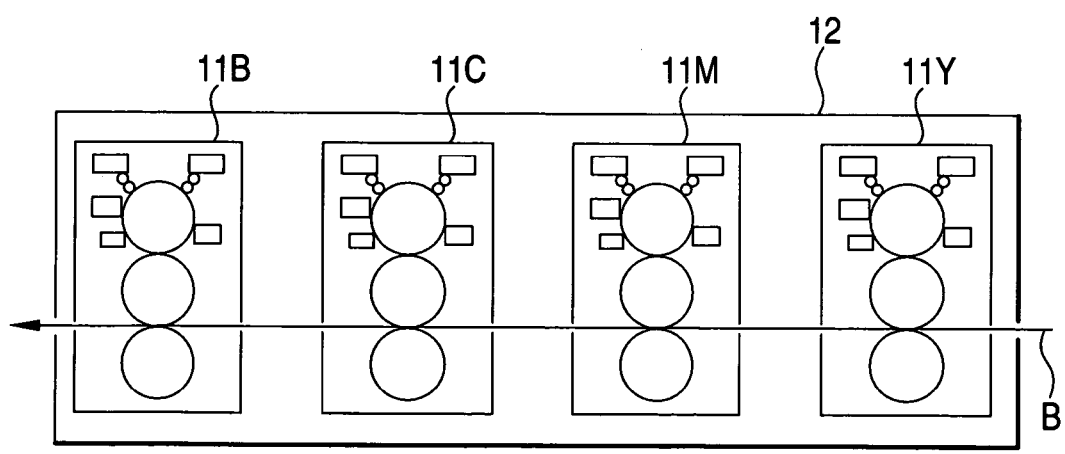
FIG. 7 is a view showing the construction of an offset printing press according to the second embodiment of the invention.

FIG. 7 is a view showing the construction of an offset printing press according to the third embodiment of the invention. The offset printing press shown in FIG. 7 is constructed so that the offset printing presses shown in FIG. 2 are used for four units 11Y, 11M, 11C and 11B that are arranged in series in the main body 12, wherein inks of Y(yellow), M(magenta), C(cyan) and B(black) are employed in the four units, respectively, to enable color printing.

Since the construction and operations of the respective printing units 11Y, 11M, 11C and 11B are the same as those of the offset printing press shown in FIG. 2 described above, detailed overlapping description thereof is omitted. The offset printing press according to the third embodiment differs from that shown in FIG. 2 in that the colors of inks supplied to the ink/damping solution sections of the respective printing units 11Y, 11M, 11C and 11B are, respectively, Y(yellow), M(magenta), C(cyan), and B(black).

Next, a description is given of the operations of the third embodiment.

First, the surface of an original plate that passes through the hydrophobic processing section 2 is processed to be hydrophobic while causing the plate cylinder 1 to slowly rotate in the printing units 11Y, 11M, 11C and 11B. Since the structure of the hydrophobic processing section is described in FIG. 6, the description thereof is omitted herein. However, since the temperature of the heating atmosphere and the temperature of the vaporizing chamber, in the case where an organic compound is caused to exist, are controlled by the control section (34 in FIG. 3), the optimal conditions are selected in response to the availability of organic compounds, type of the organic compound, and type of a thermal response substance on the surface of the original plate. After the plate cylinders are caused to rotate at a speed at which the original plate passes with a sufficient time of heating and all the surface of the plate cylinders are processed to be hydrophobic, the as-per-image irradiation is carried out in a state where the original plate is heated by the activation light irradiating section 5 with a heating device in FIG. 2, wherein depiction expressing the respective colors is carried out. And, inks of respective colors Y, M, C, and B are supplied from the respective ink/damping solution supplying sections of the respective printing units 11Y, 11M, 11C and 11B, wherein the inks and a damping solution are retained on the plate cylinders 1 of the respective printing units 11Y, 11M, 11C and 11B. After that, sheets of paper are is fed as shown by the arrow B in FIG. 7, and inks of the respective printing units 11Y, 11M, 11C and 11B are transferred onto the sheets of paper. That is, ink Y is transferred in the printing unit 11Y, ink M is transferred in the printing unit 11M, ink C is transferred in the printing unit 11C, and ink B is transferred in the printing unit 11B, whereby a color image is printed on the sheets of paper by the negative-type system.

After the printing is completed, ink remaining on the plate cylinders is removed by the ink washing-off sections of the respective printing units 11Y, 11M, 11C and 11B. After that, activation light is irradiated or the original plate is heated by the activation light irradiating section 5 while slowly rotating the plate cylinders 1, thereby making the entire surface of the plate cylinders 1 hydrophilic, wherein the plate cylinders 1 are returned to the original state before the depiction. However, it is more preferable that the hydrophilic processing step is carried out immediately before the next printing is performed, in view of avoiding the history.

While only certain embodiments of the invention have been specifically described herein, it will be apparent that numerous modifications may be made thereto without departing from the spirit and scope of the invention.

What is claimed is:

1. A planographic printing press, comprising:
   a mounting section which mounts an original printing plate having photo catalyst power;
   a processing section which hydrophobically processes the entire surface of said original plate on which a layer of a hydrophobic substance is provided;
   an activation light irradiation section which irradiates activation light one of on said original printing plate carrying the layer of said hydrophobic substance as per image and on the entire surface thereof;
   means for heating said original plate during irradiating said activation light so that the temperature of the surface of said original plate becomes 40 through 200° C. one of as per image and on the entire surface thereof, so that a hydrophobic area and a hydrophilic area are formed on said original plate;
   a section which supplies ink to said hydrophobic area and which supplies a damping solution to said hydrophilic area; and
   a printing section which prints by bringing a printing surface, on which said hydrophobic area accepts the ink and said hydrophilic area accepts the damping solution, into contact with a surface to be printed.

2. The planographic printing press according to claim 1, wherein said heating means includes a heating device for heating said original printing plate by irradiating light for maintaining the surface of said original printing plate at a predetermined temperature.

3. The planographic printing press according to claim 1, wherein said heating means includes a heating device for heating said original printing plate by electric heating for maintaining the surface of said original printing plate at a predetermined temperature.

4. The planographic printing press according to claim 1, wherein the mounting section comprises a plate cylinder.

5. The planographic printing press according to claim 4, wherein the heating means is provided inside the plate cylinder.

6. The planographic printing press according to claim 5, wherein the heating means comprises an electro-thermal heater.

7. The planographic printing press according to claim 5, wherein the heating means comprises a tungsten halogen lamp.

8. The planographic printing press according to claim 5, wherein the heating means comprises a heater and a heating roller.

9. The planographic printing press according to claim 1, wherein the processing section comprises an electric heater and a temperature controller.

10. The planographic printing press according to claim 1, wherein the activation light irradiation section comprises a mercury lamp as a light source for the activation light.

11. The planographic printing press according to claim 1, wherein the activation light contains ultraviolet ray components.

12. The planographic printing press according to claim 1, wherein the activation light irradiation section comprises a laser beam source for emitting a laser beam and a laser bean source driving section.

13. The planographic printing press according to claim 12, wherein the laser beam is a helium cadmium laser.

* * * * *